US012796249B2

(12) United States Patent
Kim et al.

(10) Patent No.: US 12,796,249 B2
(45) Date of Patent: Nov. 10, 2026

(54) DISPLAY DEVICE

(71) Applicant: Samsung Display Co., LTD., Yongin-si (KR)

(72) Inventors: Yang Hee Kim, Yongin-si (KR); Kwang Chul Jung, Yongin-si (KR); Yong Jun Jo, Yongin-si (KR); Sun Baek Hong, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 460 days.

(21) Appl. No.: 18/480,366

(22) Filed: Oct. 3, 2023

(65) Prior Publication Data

US 2024/0147793 A1 May 2, 2024

(30) Foreign Application Priority Data

Oct. 26, 2022 (KR) ........................ 10-2022-0139105

(51) Int. Cl.

*H10K 59/131* (2023.01)
*H10K 59/127* (2023.01)
*H10K 59/80* (2023.01)

(52) U.S. Cl.

CPC ....... *H10K 59/131* (2023.02); *H10K 59/1275* (2023.02); *H10K 59/873* (2023.02)

(58) Field of Classification Search

CPC . H10K 59/131; H10K 59/873; H10K 59/1275
See application file for complete search history.

(56) References Cited

U.S. PATENT DOCUMENTS

| | | | | |
|---|---|---|---|---|
| 10,782,573 B2 * | 9/2020 | Park | | G02F 1/13452 |
| 11,355,526 B2 | 6/2022 | Park et al. | | |
| 11,935,903 B2 | 3/2024 | Park et al. | | |
| 12,022,699 B2 | 6/2024 | Eom et al. | | |
| 2021/0193775 A1 * | 6/2021 | Kang | | G09G 3/3233 |
| 2022/0199750 A1 * | 6/2022 | Cho | | H10K 59/131 |

FOREIGN PATENT DOCUMENTS

| | | |
|---|---|---|
| CN | 202975551 U | 6/2013 |
| KR | 10-0560780 B1 | 3/2006 |
| KR | 10-2020-0066499 A | 6/2020 |
| KR | 10-2021-0157926 A | 12/2021 |

* cited by examiner

*Primary Examiner* — Dale E Page
*Assistant Examiner* — Wilner Jean Baptiste
(74) *Attorney, Agent, or Firm* — Womble Bond Dickinson (US) LLP

(57) ABSTRACT

A display device includes: a substrate including a display area including a plurality of pixels and a non-display area around the display area; data lines extending from the display area; a multiplexer in the non-display area and connected to the data lines; a display driving circuit in the non-display area and on one side of the multiplexer; and fan-out lines connecting the multiplexer and the display driving circuit, wherein the fan-out lines include first fan-out lines connected to the multiplexer and second fan-out lines connected to the first fan-out lines and the display driving circuit, and the first fan-out lines and the second fan-out lines are on different layers.

22 Claims, 20 Drawing Sheets

ACT: DTCH, DTS, DTD, CH6, S6, D6
GTL1: DTG, EL, G6
GTL2: HVDL
LEL: 171, 172, 173

DISPLAY DEVICE

CROSS-REFERENCE TO RELATED APPLICATION

The present application claims priority to and the benefit of Korean Patent Application No. 10-2022-0139105 filed on Oct. 26, 2022 in the Korean Intellectual Property Office, the entire content of which is incorporated herein by reference.

BACKGROUND

1. Field

Aspects of some embodiments of the present disclosure relate to a display device.

2. Description of the Related Art

As the information society develops, consumer demand for display devices for displaying images is increasing in various forms. For example, display devices may be applied to, or incorporated within, various electronic devices such as a smart phone, a digital camera, a notebook computer, a navigation system, a smart watch, and a smart television. Display devices include, for example, flat panel display devices such as liquid crystal display devices, field emission display devices, or organic light emitting display devices.

Display devices generally include a plurality of pixels, and each of the plurality of pixels includes a light emitting element, a driving transistor controlling an amount of a driving current supplied to the light emitting element from a power source according to a voltage of a gate electrode, a plurality of switch elements switched according to scan signals of a scan line, and a plurality of capacitors.

Additionally, display devices generally include a display area at which images are displayed and a non-display area arranged around the display area. A plurality of lines for applying a signal to the display area may be located the non-display area. Resistances of the plurality of lines generally increase or resistances between the lines varies according to a length or a line width thereof, and thus a display quality may deteriorate.

The above information disclosed in this Background section is only for enhancement of understanding of the background and therefore the information discussed in this Background section does not necessarily constitute prior art.

SUMMARY

Aspects of some embodiments of the present disclosure include a display device that may be capable of reducing resistances of a plurality of lines located in a non-display area and equalizing or conforming resistances between the lines.

However, characteristics of embodiments of the present disclosure are not restricted to those set forth herein. The above and other characteristics of embodiments according to the present disclosure will become more apparent to one of ordinary skill in the art to which the present disclosure pertains by referencing the detailed description of the present disclosure given below.

According to some embodiments of the present disclosure, a display device comprises a substrate including a display area including a plurality of pixels and a non-display area around the display area, data lines extending from the display area, a multiplexer in the non-display area and to which the data lines are connected, a display driving circuit in the non-display area and on one side of the multiplexer, and fan-out lines connecting the multiplexer and the display driving circuit, wherein the fan-out lines include first fan-out lines connected to the multiplexer and second fan-out lines connected to the first fan-out lines and the display driving circuit, and the first fan-out lines and the second fan-out lines are on different layers.

According to some embodiments, the first fan-out lines and the second fan-out lines include different materials.

According to some embodiments, the first fan-out lines include a first-first fan-out line and a first-second fan-out line spaced apart from each other, and the first-first fan-out line and the first-second fan-out line are alternately arranged in one direction.

According to some embodiments, the first-first fan-out line is electrically connected to any one of the second fan-out lines corresponding to the first-first fan-out line through a first contact hole, and the first-second fan-out line is electrically connected to the other one of the second fan-out lines corresponding to the first-second fan-out line through a second contact hole.

According to some embodiments, the non-display area includes a first gate metal layer on the substrate, a first interlayer insulating layer on the first gate metal layer, a second gate metal layer on the first interlayer insulating layer, a second interlayer insulating layer on the second gate metal layer, and a data metal layer on the second interlayer insulating layer.

According to some embodiments, the first fan-out lines include a first-first fan-out line and a first-second fan-out line spaced apart from each other, the first-first fan-out line is made of the first gate metal layer, the first-second fan-out line is made of the second gate metal layer, and the second fan-out lines are made of the data metal layer.

According to some embodiments, the display device further comprises a driving voltage line on the non-display area of the substrate and between the multiplexer and the display driving circuit, wherein the driving voltage line overlaps the first fan-out line and does not overlap the second fan-out line.

According to some embodiments, the display device further comprises a low potential line on the non-display area of the substrate and around the display area, wherein the low potential line overlaps the first fan-out line and does not overlap the second fan-out line.

According to some embodiments, the driving voltage line and the low potential line are on the same layer as the second fan-out line, and are spaced apart from each other in plan view.

According to some embodiments, the display device further comprises a coupling member on the non-display area of the substrate and around the display area, and an encapsulation substrate coupled to the substrate through the coupling member, wherein the coupling member overlaps the first fan-out line and does not overlap the second fan-out line.

According to some embodiments of the present disclosure, a display device comprises a substrate, a first-first fan-out line on the substrate, a first interlayer insulating layer on the first-first fan-out line, a first-second fan-out line on the first interlayer insulating layer, a second interlayer insulating layer on the first-second fan-out line, and second fan-out lines on the second interlayer insulating layer, wherein any one of the second fan-out lines overlaps the first-first fan-out line and is connected to the first-first fan-out line through a first contact hole, and the other of the second fan-out lines overlaps the first-second fan-out line and is connected to the first-second fan-out line through a second contact hole, and the first-first fan-out line and the first-second fan-out line include a material different from that of the second fan-out line.

According to some embodiments, the display device further comprises a driving voltage line on the second interlayer insulating layer and spaced apart from the second fan-out line, a via layer on the driving voltage line and the second interlayer insulating layer, a coupling member on the driving voltage line and the second interlayer insulating layer, and an encapsulation substrate on the coupling member.

According to some embodiments, the driving voltage line overlaps the via layer, the coupling member, the first-first fan-out line, and the first-second fan-out line.

According to some embodiments, the via layer includes a groove exposing a portion of the driving voltage line and a portion of the second interlayer insulating layer, and the coupling member is in the groove and is in contact with the driving voltage line and the second interlayer insulating layer.

According to some embodiments, the coupling member overlaps the first-first fan-out line and the first-second fan-out line, and does not overlap the second fan-out line.

According to some embodiments of the present disclosure, a display device comprises a substrate including a display area and a non-display area around the display area, a driving voltage line in the non-display area and applying a driving voltage to the display area, a display driving circuit in the non-display area and on one side of the driving voltage line, and fan-out lines electrically connecting the display area and the display driving circuit to each other, wherein the fan-out lines include first fan-out lines that overlap the driving voltage line and second fan-out lines that do not overlap the driving voltage line, and the first fan-out lines and the second fan-out lines include different materials.

According to some embodiments, the driving voltage line includes a bending portion formed in a bent shape in plan view, and partitions a well portion that is an area surrounded by the bending portion.

According to some embodiments, the first fan-out lines are connected to the second fan-out lines through contact holes, and at least some of the contact holes overlap the well portion.

According to some embodiments, the first fan-out lines are connected to the second fan-out lines through contact holes, and at least some of the contact holes are arranged to be spaced apart from each other in a first direction and arranged to be spaced apart from each other in a second direction perpendicular to the first direction toward the center of the display area.

According to some embodiments, a virtual line connecting the contact holes is an oblique line passing between the first direction and the second direction.

According to some embodiments, at least two of the second fan-out lines include a contact portion connected to the first fan-out lines, a first area extending from the contact portion, a second area extending in a vertical direction, and a connection portion connecting the first area and the second area, and the connecting portion is a bent portion between the first area and the second area.

According to some embodiments, a length of the first area and a length of the second area are different from each other.

According to some embodiments, the at least two second fan-out lines have a length of the first area that decreases toward the center of the display area and a length of the second area that increases toward the center of the display area.

According to some embodiments, the at least two second fan-out lines have different lengths of the second area and different lengths of the first area.

In a display device according to some embodiments, line resistances of fan-out lines may be relatively reduced by forming one fan-out line as first and second fan-out lines made of different materials. Accordingly, it may be possible to prevent or reduce deterioration of display quality due to line resistance and to enable driving of a multiplexer requiring low resistance of the fan-out lines.

However, the characteristics of the embodiments are not restricted to those set forth herein. The above and other characteristics of the embodiments will become more apparent to one of daily skill in the art to which the embodiments pertain by referencing the claims, and their equivalents.

BRIEF DESCRIPTION OF THE DRAWINGS

The above and other aspects and features of the present disclosure will become more apparent by describing in more detail aspects of some embodiments thereof with reference to the attached drawings, in which.

DETAILED DESCRIPTION

Aspects of some embodiments of the present disclosure will now be described more fully hereinafter with reference to the accompanying drawings, in which aspects of some embodiments of the invention are shown. This invention may, however, be embodied in different forms and should not be construed as limited to the embodiments set forth herein. Rather, these embodiments are provided so that this disclosure will be more thorough and more complete, and will more fully convey the scope of embodiments according to the present invention to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element.

Each of the features of the various embodiments of the present disclosure may be combined or combined with each other, in part or in whole, and technically various interlocking and driving are possible. Each embodiment may be implemented independently of each other or may be implemented together in an association.

Hereinafter, specific embodiments will be described with reference to the accompanying drawings.

Figure 1:
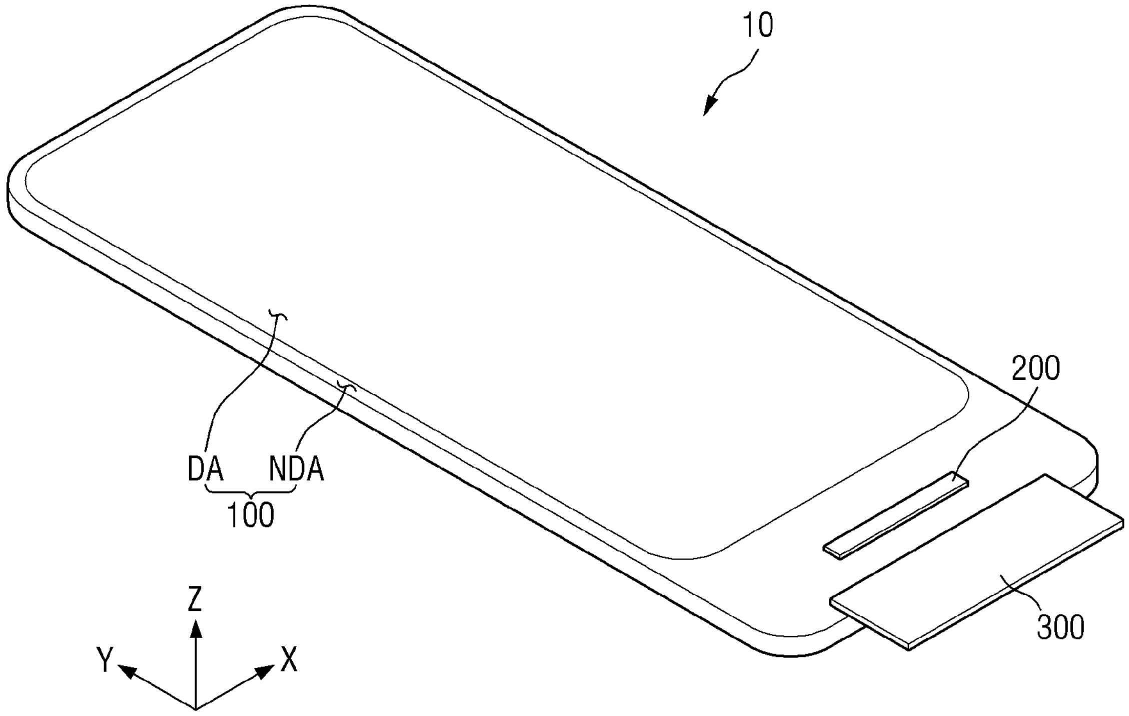
FIG. 1 is a perspective view illustrating a display device according to some embodiments.

FIG. 1 is a perspective view illustrating a display device according to some embodiments.

Referring to FIG. 1, a display device 10 is a device that displays a moving image (e.g., video images) or a still image (e.g., static images), and may be used as a display screen of each of various products such as televisions, laptop computers, monitors, billboards, and Internet of Things (IoT) as well as portable electronic devices such as mobile phones, smartphones, tablet personal computers (PCs), smartwatches, watch phones, mobile communication terminals, electronic organizers, electronic books, portable multimedia players (PMPs), navigation devices, and ultra mobile PCs (UMPCs).

The display device 10 may be a light emitting display device such as an organic light emitting display device using an organic light emitting diode, a quantum dot light emitting display device including a quantum dot light emitting layer, an inorganic light emitting display device including an inorganic semiconductor, and a micro light emitting display device using a micro or nano light emitting diode (micro LED or nano LED). Hereinafter, it is mainly described that the display device 10 is the organic light emitting display device, but embodiments according to the present disclosure are not limited thereto.

The display device 10 includes a display panel 100, a display driving circuit 200, and a circuit board 300.

The display panel 100 may be formed in a rectangular plane having a short side in a first direction (X-axis direction) and a long side in a second direction (Y-axis direction) intersecting the first direction (X-axis direction). A corner where the short side in the first direction (X-axis direction) and the long side in the second direction (Y-axis direction) meet may be rounded to have a curvature (e.g., a set or predetermined curvature) or may be formed at a right angle. The planar shape of the display panel 100 is not limited to the rectangular shape, and may be other polygonal shapes, a circular shape, or an elliptical shape. The display panel 100 may be formed to be flat, but is not limited thereto. For example, the display panel 100 may include curved surface portions formed at left and right distal ends thereof and having a constant curvature or a variable curvature. In addition, the display panel 100 may be rigid, but is not limited thereto, and may also be flexibly formed to be curved, bent, folded, or rolled.

The display panel 100 may include a display area DA that displays images and a non-display area NDA that is in a peripheral area (e.g., outside a footprint in a plan view) of the display area DA. The display area DA may include a plurality of pixels configured to collectively display images.

The display driving circuit 200 may generate signals and voltages for driving the display panel 100. The display driving circuit 200 may be formed, for example, as an integrated circuit (IC) and may be attached onto the display panel 100 using any suitable bonding method, for example, by a chip on glass (COG) method, a chip on plastic (COP) method, or an ultrasonic bonding method, but the bonding method is not limited thereto. For example, the display driving circuit 200 may be attached onto the circuit board 300 in a chip on film (COF) manner. According to some embodiments, the COG manner will be described as an example.

The circuit board 300 may be attached to one end of the display panel 100. Therefore, the circuit board 300 may be electrically connected to the display panel 100 and the display driving circuit 200. The display panel 100 and the display driving circuit 200 may receive digital video data, timing signals, and driving voltages through the circuit board 300. The circuit board 300 may be a flexible film such as a flexible printed circuit board, a printed circuit board, or a chip on film.

Figure 2:
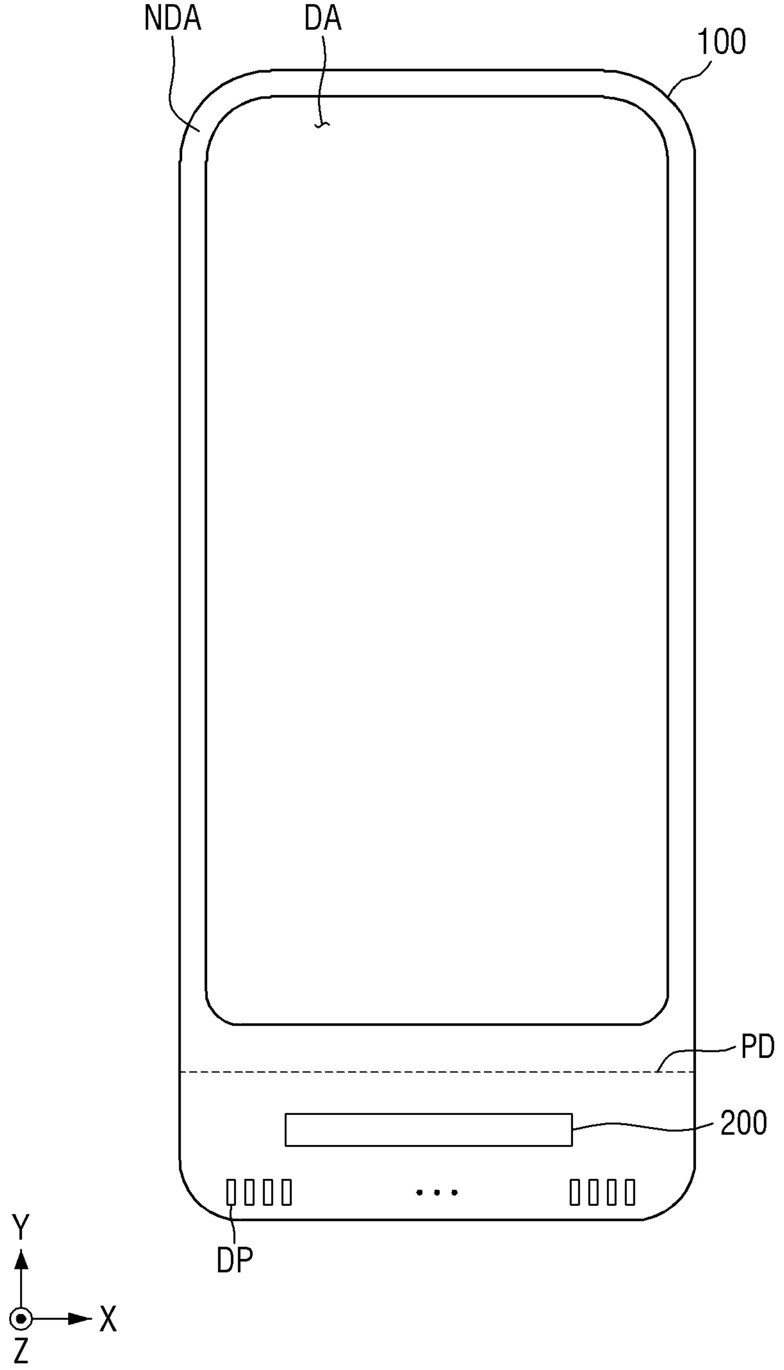
FIG. 2 is a plan view illustrating the display device according to some embodiments.
Figure 3:
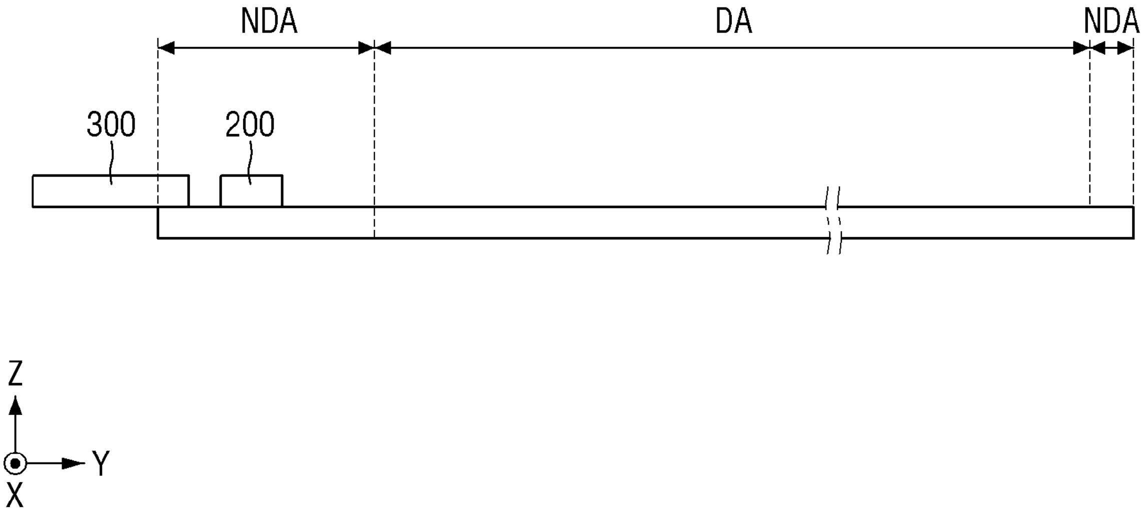
FIG. 3 is a side view illustrating the display device according to some embodiments.

FIG. 2 is a plan view illustrating the display device according to some embodiments. FIG. 3 is a side view illustrating the display device according to some embodiments.

Referring to FIGS. 2 and 3, the display panel 100 may include a display area DA and a non-display area NDA.

The display panel 100 may include the display area DA that displays images and the non-display area NDA that is the peripheral area of the display area DA. The display area DA may occupy most of an area of the display panel 100. The display area DA may be located at the center of the display panel 100.

The non-display area NDA may be arranged to surround the display area DA, and may be at an area outside (e.g., in a periphery or outside a footprint in a plan view) of the display area DA. The non-display area NDA may be an edge area of the display panel 100.

The non-display area NDA may include a pad area PD located on one side. The pad area PD, which is a portion of the non-display area NDA, may be located on one side of the display area DA in a second direction (Y-axis direction). The pad area PD may include a plurality of fan-out lines ('FL' in FIG. 4) connecting a plurality of signal lines existing in the display area DA and the display driving circuit 200.

In addition, in the pad area PD, a plurality of pads DP and the display driving circuit 200 may be located. The display driving circuit 200 may be attached to driving pads of the pad area PD using a low-resistance and high-reliability material such as an anisotropic conductive film or a self-assembly anisotropic conductive paste (SAP). The circuit board 300 may be attached to the plurality of pads DP of the pad area PD using the low-resistance and high-reliability material such as the anisotropic conductive film or the SAP.

Figure 4:
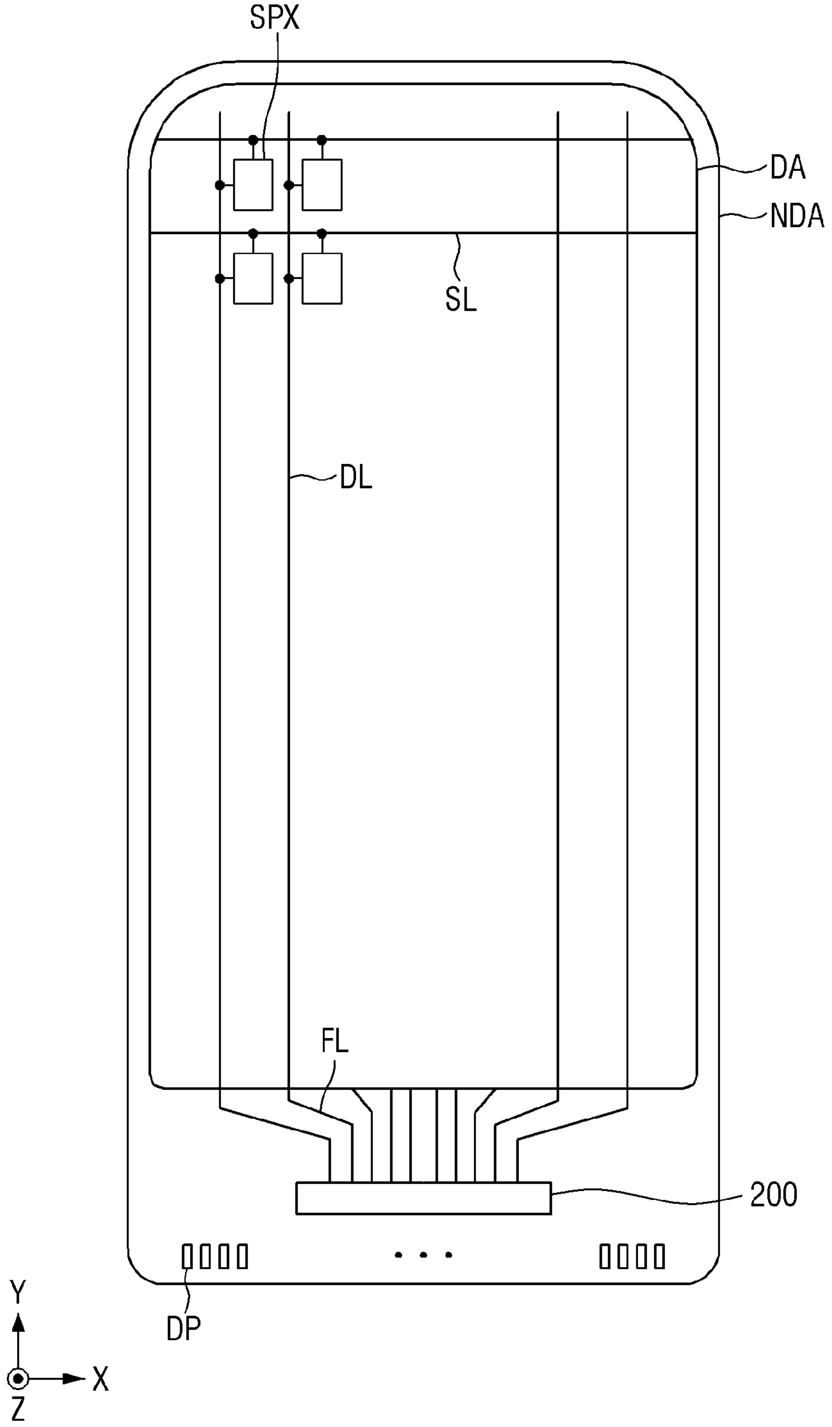
FIG. 4 is a plan view illustrating sub-pixels and signal lines of the display device according to some embodiments.

FIG. 4 is a plan view illustrating sub-pixels and signal lines of the display device according to some embodiments.

Referring to FIG. 4, the display area DA of the display panel 100 may include sub-pixels SP, scan lines SL, and data lines DL. The scan lines SL may extend in the first direction (X-axis direction) and may be arranged in the second direction (Y-axis direction). The data lines DL may extend in the second direction (Y-axis direction) and may be arranged in the first direction (X-axis direction).

Each of the sub-pixels SPX may be connected to the scan line SL and the data line DL. Each of the sub-pixels SPX may include a driving transistor (e.g., the driving transistor DT shown in FIG. 5), a plurality of switch elements (e.g., the switch elements ST1-ST6 shown in FIG. 5), a light emitting element (e.g., the light emitting element LEL shown in FIG. 5), and a capacitor (e.g., the capacitor C1 shown in FIG. 5).

One or more of the plurality of switch elements may be controlled, for example, by the scan lines SL, so that a data voltage of the data lines DL may be applied to a gate electrode of a driving transistor.

The driving transistor supplies a driving current to the light emitting element according to the data voltage applied to the gate electrode thereof, so that the light emitting element may emit light. The light emitting element may emit light according to the driving current of the driving transistor. That is, the light emitting element may emit light with a luminance and duration based on the driving current flowing through the driving transistor. The light emitting element may be an organic light emitting diode including a first electrode, an organic light emitting layer, and a second electrode. Alternatively, the light emitting element may be an inorganic light emitting diode including a first electrode, an inorganic semiconductor, and a second electrode. Alternatively, the light emitting element may be a micro light emitting diode in a micro unit or a nano unit. The capacitor may serve to maintain the data voltage applied to the gate electrode of the driving transistor for a period (e.g., a set or predetermined period). Further details of the sub-pixel SPX will be described later with reference to FIG. 5.

The non-display area NDA of the display panel 100 may include the fan-out lines FL connecting the data lines DL of the display area DA and the display driving circuit 200. According to some embodiments, the non-display area NDA may further include a fan-out line connecting a scan driving unit for applying a signal to the scan line and the scan lines SL.

The fan-out lines FL may be located in the non-display area NDA. The fan-out lines FL may extend to the pad area PD to electrically connect the display area DA and the display driving circuit 200. As another example, the fan-out lines FL may be electrically connected to the display driving circuit 200 by being connected to another fan-out line located between the fan-out line FL and the display driving circuit 200. Further details according to some embodiments will be described later.

Figure 5:
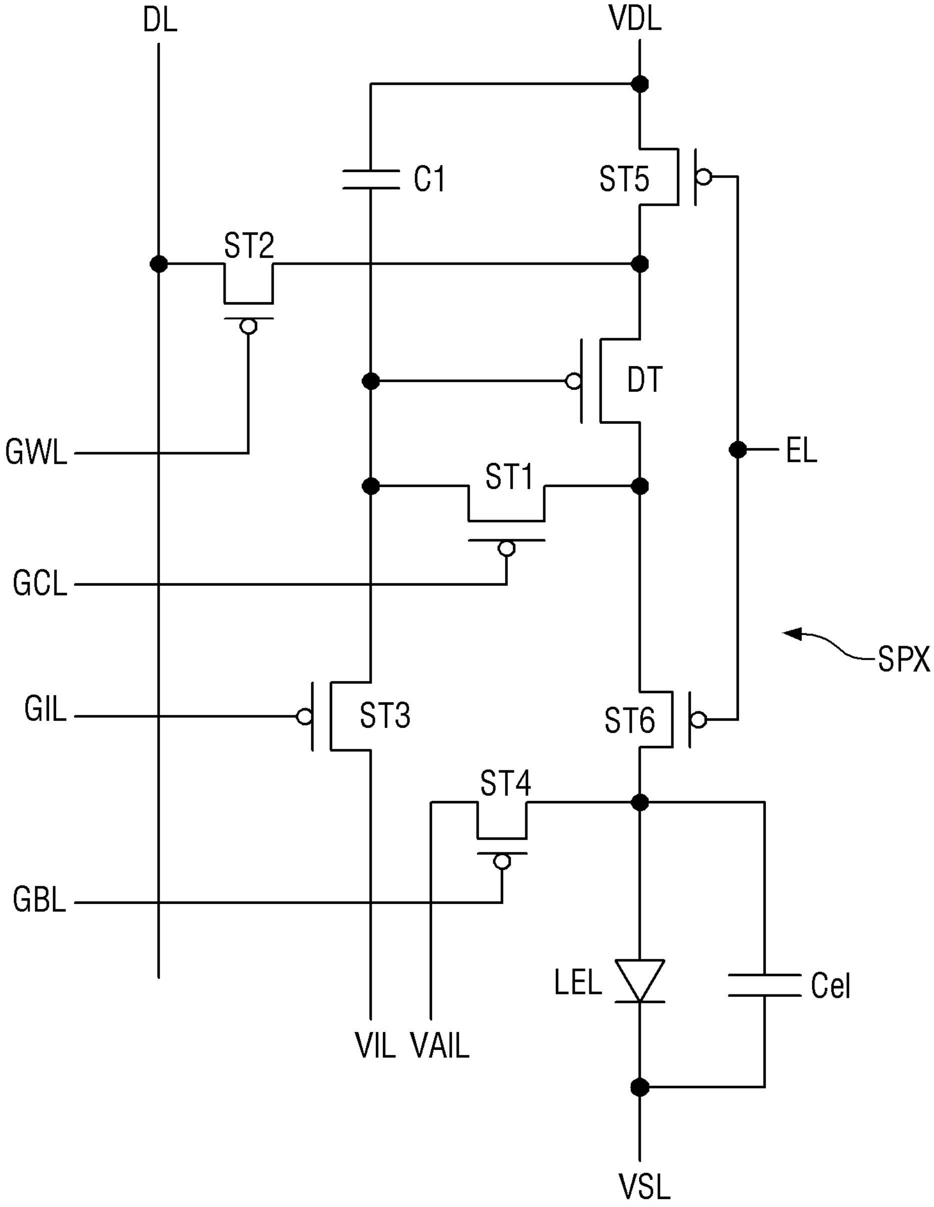
FIG. 5 is a circuit diagram illustrating a sub-pixel according to some embodiments.

FIG. 5 is a circuit diagram illustrating a sub-pixel according to some embodiments.

Referring to FIG. 5, the sub-pixel SPX may be connected to at least one of the scan lines GWL, GIL, or GCL, any one of the light-emitting control lines EL, or any one of the data lines. For example, the sub-pixel SPX may be connected to a scan write line GWL, a scan initialization line GIL, a scan control line GCL, a light emitting control line EL, and a data line DL.

The sub-pixel SPX may include a light emitting element LEL, a driving transistor DT, switch elements, and a capacitor C1. The switch elements may include first to sixth transistors ST1, ST2, ST3, ST4, ST5, and ST6.

The driving transistor DT may include a gate electrode, a first electrode, and a second electrode. The driving transistor DT controls a drain-source current Ids (hereinafter, referred to as a "driving current") flowing between the first electrode and the second electrode according to a data voltage applied to the gate electrode thereof. The gate electrode of the driving transistor DT may be connected to the capacitor C1, the first electrode thereof may be connected to a second electrode of the fifth transistor ST5, and the second electrode thereof may be connected to a first electrode of the first transistor ST1 and a first electrode of the sixth transistor ST6.

The light emitting element LEL emits light according to the driving current Ids. An amount of light emitted from the light emitting element LEL may be proportional to the driving current Ids. An anode electrode of the light emitting element LEL may be connected to a first electrode of the fourth transistor ST4 and a second electrode of the sixth transistor ST6, and a cathode electrode thereof may be connected to a low potential line VSL. A parasitic capacitance Cel may be formed between the anode electrode and the cathode electrode of the light emitting element LEL.

The capacitor C1 is formed between the gate electrode of the driving transistor DT and the driving voltage line VDL. One electrode of the capacitor C1 may be connected to the gate electrode of the driving transistor DT, and the other electrode thereof may be connected to the driving voltage line VDL.

The first transistor ST1 is turned on by the scan control signal applied to the scan control line GCL. In response to the scan control signal applied to the scan control line GCL, the first transistor ST1 may connect the capacitor C1 and the second electrode of the driving transistor DT. A gate electrode of the first transistor ST1 may be connected to the scan control line GCL, the first electrode thereof may be connected to the second electrode of the driving transistor DT, and a second electrode thereof may be connected to the capacitor C1. Thus, according to some embodiments, when the first transistor ST1 is turned on in response to the scan control signal, the first transistor ST1 may become diode-connected such that the gate electrode of the driving transistor DT is electrically connected to the second electrode of the driving transistor DT through the first transistor ST1.

The second transistor ST2 is turned on by the scan write signal of the scan write line GWL to connect the first electrode of the driving transistor DT and the data line DL. A gate electrode of the second transistor ST2 may be connected to the scan write line GWL, a first electrode thereof may be connected to the data line DL, and a second electrode thereof may be connected to the first electrode of the driving transistor DT.

The third transistor ST3 is turned on by the scan initialization signal of the scan initialization line GIL to connect a node connected to the first electrode of the first transistor ST1 and the first initialization voltage line VIL. A gate electrode of the third transistor ST3 may be connected to the scan initialization line GIL, a first electrode thereof may be connected to the first initialization voltage line VIL, and a second electrode thereof may be connected to the node connected to the first transistor ST1.

The fourth transistor ST4 is turned on by a scan bias signal of a scan bias line GBL to connect the anode electrode of the light emitting element LEL and a second initialization voltage line VAIL. The light emitting element LEL may be discharged to a second initialization voltage of the second initialization voltage line VAIL. A gate electrode of the fourth transistor ST4 may be connected to the scan bias line GBL, the first electrode thereof may be connected to the second initialization voltage line VAIL, and a second electrode thereof may be connected to the anode electrode of the light emitting element LEL.

The fifth transistor ST5 is turned on by the light emitting control signal of the light emitting control line EL to connect the driving transistor DT and the driving voltage line VDL. A gate electrode of the fifth transistor ST5 may be connected to the light emitting control line EL, a first electrode thereof may be connected to the driving voltage line VDL, and the second electrode thereof may be connected to the first electrode of the driving transistor DT.

The sixth transistor ST6 is turned on by the light emitting control signal of the light emitting control line EL to connect the second electrode of the driving transistor DT and the anode electrode of the light emitting element LEL. A gate electrode of the sixth transistor ST6 is connected to the light emitting control line EL, the first electrode thereof is connected to the second electrode of the driving transistor DT, and the second electrode thereof is connected to the anode electrode of the light emitting element LEL. When the sixth transistor ST6 is turned on, the driving current Ids may be supplied to the light emitting element LEL.

As illustrated in FIG. 5, all of the first to sixth transistors ST1, ST2, ST3, ST4, ST5, and ST6, and the driving transistor DT may be formed as a P-type metal oxide semiconductor field effect transistor (MOSFET). An active layer of each of the first to sixth transistors ST1, ST2, ST3, ST4, ST5, and ST6 and the driving transistor DT may be formed of polysilicon or an oxide semiconductor.

The first to sixth transistors ST1, ST2, ST3, ST4, ST5, and ST6 are formed as the P-type MOSFET, and may thus be turned on when a scan signal and a light emitting signal of a gate low voltage are applied to the scan control line GCL, the scan initialization line GIL, the scan write line GWL, the scan bias line GBL, and the light emitting control line EL, respectively.

Additionally, embodiments according to the present invention are not limited to the components of the sub-pixel SPX illustrated in FIG. 5. For example, according to some embodiments, the sub-pixel SPX may include additional components or fewer components without departing from the spirit and scope of embodiments according to the present disclosure.

Figure 6:
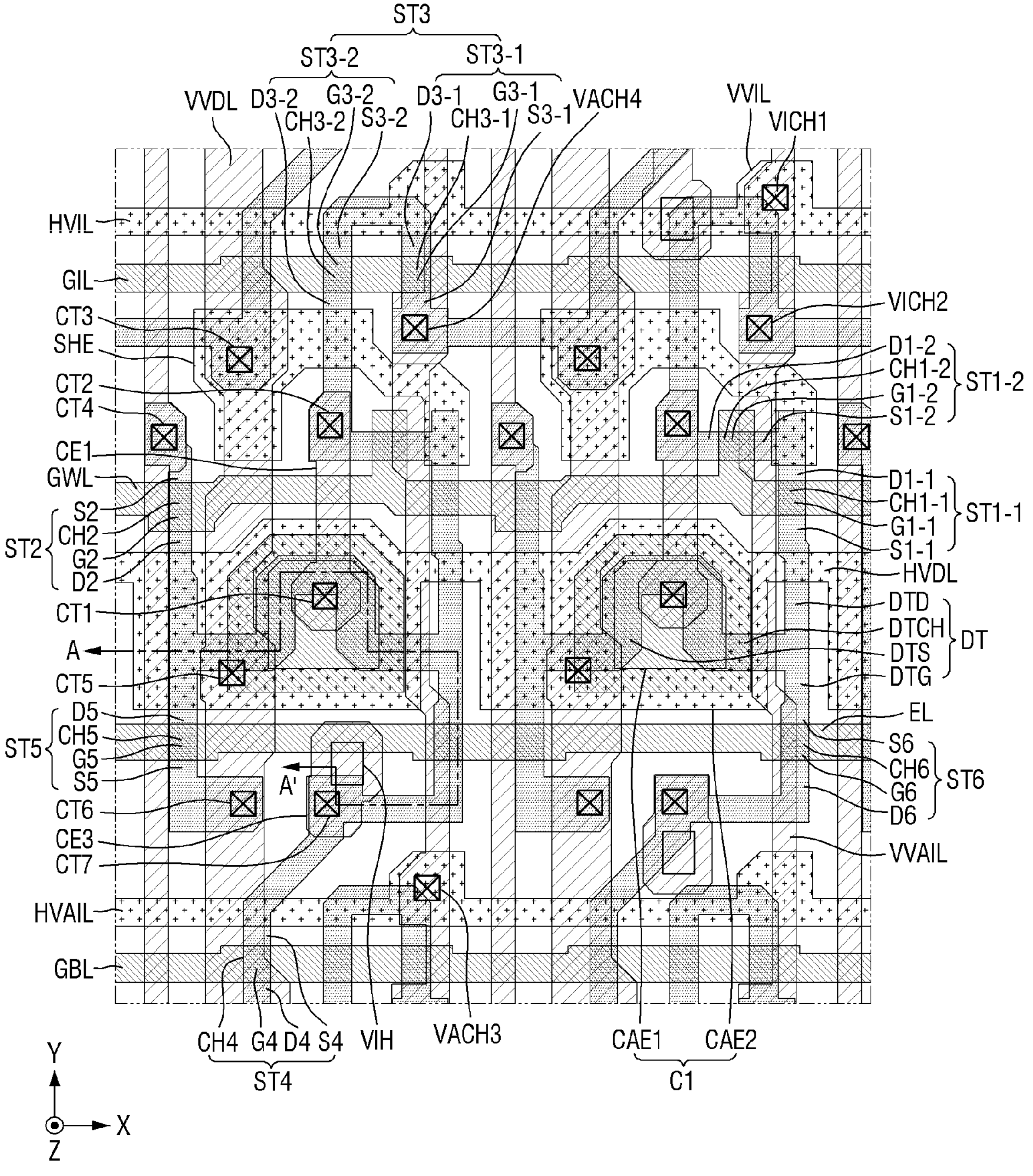
FIG. 6 is a layout view illustrating in detail a pixel of a display panel according to some embodiments.

FIG. 6 is a layout view illustrating in more detail a pixel of a display panel according to some embodiments.

In FIG. 6, an active layer, a first gate metal layer, a second gate metal layer, and a data metal layer are illustrated.

Referring to FIG. 6, the scan write lines GWL, the scan initialization lines GIL, the scan bias lines GBL, and the light emitting control lines EL may extend in the first direction (X-axis direction). In addition, first horizontal initialization lines HVIL, second horizontal initialization lines HVAIL, and horizontal driving voltage lines HVDL may extend in a first direction (X-axis direction).

First vertical initialization lines VVIL, second vertical initialization lines VVAIL, and vertical driving voltage lines VVDL may extend in the second direction (Y-axis direction). In addition, the data lines DL may extend in the second direction (Y-axis direction).

The pixel PX may include a driving transistor DT, first to sixth transistors ST1 to ST6, a capacitor CST, and connection electrodes CE1 and CE2. The first transistor ST1 may include a first-first transistor ST1-1 and a first-second transistor ST1-2. The third transistor ST3 may include a third-first transistor ST3-1 and a third-second transistor ST3-2.

The driving transistor DT may include a channel layer DTCH, a gate electrode DTG, a first electrode DTS, and a second electrode DTD. The channel layer DTCH of the driving transistor DT may overlap the gate electrode DTG of the driving transistor DT. The gate electrode DTG of the driving transistor DT may be located on the channel layer DTCH of the driving transistor DT.

The gate electrode DTG of the driving transistor DT may be connected to the first connection electrode CE1 through a first contact hole CT1. The first connection electrode CE1 may be connected to a second electrode D1-2 of the first-second transistor ST1-2 through a second contact hole CT2.

The first electrode DTS of the driving transistor DT may be connected to a second electrode D2 of the second transistor ST2 and a second electrode D5 of the fifth transistor ST5. The second electrode DTD of the driving transistor DT may be connected to a first electrode S1-1 of the first-first transistor ST1-1 and a first electrode S6 of the sixth transistor ST6.

The first-first transistor ST1-1 may include a channel layer CH1-1, a gate electrode G1-1, a first electrode S1-1, and a second electrode D1-1. The channel layer CH1-1 of the first-first transistor ST1-1 may overlap the gate electrode G1-1 of the first-first transistor ST1-1. The gate electrode G1-1 of the first-first transistor ST1-1 may be formed integrally (e.g., as a single continuous body or material) with the scan write line GWL. The gate electrode G1-1 of the first-first transistor ST1-1 may be a portion of the scan write line GWL. The first electrode S1-1 of the first-first transistor ST1-1 may be connected to the second electrode DTD of the driving transistor DT. The second electrode D1-1 of the first-first transistor ST1-1 may be connected to a first electrode S1-2 of the first-second transistor ST1-2.

The first-second transistor ST1-2 may include a channel layer CH1-2, a gate electrode G1-2, a first electrode S1-2, and a second electrode D1-2. The channel layer CH1-2 of the first-second transistor ST1-2 may overlap the gate electrode G1-2 of the first-second transistor ST1-2. The gate electrode G1-2 of the first-second transistor ST1-2 may be formed integrally (e.g., as a single continuous body or material) with the scan write line GWL. The gate electrode G1-2 of the first-second transistor ST1-2 may protrude in the second direction (Y-axis direction) from the can write line GWL. The first electrode S1-2 of the first-second transistor ST1-2 may be connected to the second electrode D1-2 of the first-first transistor ST1-1. The second electrode D1-2 of the first-second transistor ST1-2 may be connected to the first connection electrode CE1.

The second transistor ST2 may include a channel layer CH2, a gate electrode G2, a first electrode S2, and a second electrode D2. The channel layer CH2 of the second transistor ST2 may overlap the gate electrode G2 of the second transistor ST2. The gate electrode G2 of the second transistor ST2 may be formed integrally (e.g., as a single continuous body or material) with the scan write line GWL. The gate electrode G2 of the second transistor ST2 may be a portion of the scan write line GWL. The first electrode S1 of the second transistor ST2 may be connected to the data line DL through a fourth contact hole CT4. The second electrode D2 of the second transistor ST2 may be connected to the first electrode DTS of the driving transistor DT.

The third-first transistor ST3-1 may include a channel layer CH3-1, a gate electrode G3-1, a first electrode S3-1, and a second electrode D3-1. The channel layer CH3-1 of the third-first transistor ST3-1 may overlap the gate electrode G3-1 of the third-first transistor ST3-1. The gate electrode G3-1 of the third-first transistor ST3-1 may be formed integrally (e.g., as a single continuous body or material) with the scan initialization line GIL. The gate electrode G3-1 of the third-first transistor ST3-1 may be a portion of the scan initialization line GIL. The first electrode S3-1 of the third-first transistor ST3-1 may be connected to the first connection electrode CE1. The second electrode D3-1 of the third-first transistor ST3-1 may be connected to the first electrode S3-2 of the third-second transistor ST3-2.

The third-second transistor ST3-2 may include a channel layer CH3-2, a gate electrode G3-2, a first electrode S3-2, and a second electrode D3-2. The channel layer CH3-2 of the third-second transistor ST3-2 may overlap the gate electrode G3-2 of the third-second transistor ST3-2. The gate electrode G3-2 of the third-second transistor ST3-2 may be formed integrally (e.g., as a single continuous body or material) with the scan initialization line GIL. The gate electrode G3-2 of the third-second transistor ST3-2 may be a portion of the scan initialization line GIL. The first electrode S3-2 of the third-second transistor ST3-2 may be connected to the second electrode D3-1 of the third-first transistor ST3-1. The second electrode D3-2 of the third-second transistor ST3-2 may be connected to the first vertical initialization line VVIL through a second initialization contact hole VICH2.

The fourth transistor ST4 may include a channel layer CH4, a gate electrode G4, a first electrode S4, and a second electrode D4. The channel layer CH4 of the fourth transistor ST4 may overlap the gate electrode G4 of the fourth transistor ST4. The gate electrode G4 of the fourth transistor ST4 may be formed integrally (e.g., as a single continuous body or material) with the scan bias line GBL. The gate electrode G4 of the fourth transistor ST4 may be a portion of the scan bias line GBL. The first electrode S4 of the fourth transistor ST4 may be connected to the second connection electrode CE2 through a seventh contact hole CH7. The second electrode D4 of the fourth transistor ST4 may be connected to the second vertical initialization line VVAIL through a first initialization contact hole VICH1.

The fifth transistor ST5 may include a channel layer CH5, a gate electrode G5, a first electrode S5, and a second electrode D5. The channel layer CH5 of the fifth transistor ST5 may overlap the gate electrode G5 of the fifth transistor ST5. The gate electrode G5 of the fifth transistor ST5 may be formed integrally (e.g., as a single continuous body or material) with the light emitting control line EL. The gate electrode G5 of the fifth transistor ST5 may be a portion of the light emitting control line EL. The first electrode S5 of the fifth transistor ST5 may be connected to the vertical driving voltage line VVDL through a sixth contact hole CT6. The second electrode D5 of the fifth transistor ST5 may be connected to the first electrode DTS of the driving transistor DT.

The sixth transistor ST6 may include a channel layer CH6, a gate electrode G6, a first electrode S6, and a second electrode D6. The channel layer CH6 of the sixth transistor ST6 may overlap the gate electrode G6 of the sixth transistor ST6. The gate electrode G6 of the sixth transistor ST6 may be formed integrally (e.g., as a single continuous body or material) with the light emitting control line EL. The gate electrode G6 of the sixth transistor ST6 may be a portion of the light emitting control line EL. The first electrode S6 of the sixth transistor ST6 may be connected to the second electrode DTD of the driving transistor DT. The second electrode D6 of the sixth transistor ST6 may be connected to the third connection electrode CE3 through the seventh contact hole CH7.

A first electrode CAE1 of the capacitor CST may be formed integrally (e.g., as a single continuous body or material) with the gate electrode DTG of the driving transistor DT. The first electrode CAE1 of the capacitor CST may be a portion of the gate electrode DTG of the driving transistor DT. A second electrode CAE2 of the capacitor CST may be formed integrally (e.g., as a single continuous body or material) with the horizontal driving voltage line HVDL. The second electrode CAE2 of the capacitor CST may be a portion of the horizontal driving voltage line HVDL. The second electrode CAE2 of the capacitor CST may overlap the first electrode CAE1 of the capacitor CST. The horizontal driving voltage line HVDL may be connected to the vertical driving voltage line VVDL through a fifth contact hole CT5.

The first connection electrode CE1 may be connected to the gate electrode DTG of the driving transistor DT through the first contact hole CT1, and may be connected to the second electrode D1-2 of the first-second transistor ST1-2 and the first electrode D1-2 of the third-first transistor ST3-1 through the second contact hole CT2. The first connection electrode CE1 may extend in the second direction (Y-axis direction). The first connection electrode CE1 may overlap the scan write line GWL and the horizontal driving voltage line HVDL. The second connection electrode CE2 may be connected to the second electrode D6 of the sixth transistor ST6 through the seventh contact hole CT7.

A shielding electrode SHE may be connected to the vertical driving voltage line VVDL through a third contact hole CT3. The shielding electrode SHE may overlap the second electrode D1-2 of the first-first transistor ST1-1 and the first electrode S1-2 of the first-second transistor ST1-2. In addition, the shielding electrode SHE may overlap the first electrode S3-1 of the third-first transistor ST3-1.

The first horizontal initialization line HVIL and the second horizontal initialization line HVAIL may extend in the first direction (X-axis direction). The first horizontal initialization line HVIL and the second horizontal initialization line HVAIL may be alternately arranged in the second direction (Y-axis direction). The first vertical initialization line VVIL and the second vertical initialization line VVAIL may extend in the second direction (Y-axis direction). The first vertical initialization line VVIL and the second vertical initialization line VVAIL may be alternately arranged in the first direction (X-axis direction).

The first vertical initialization line VVIL may be connected to the first horizontal initialization line HVIL through the first initialization contact hole VICH1. The first vertical initialization line VVIL may be connected to the second electrode D3-2 of the third transistor ST3-2 through the second initialization contact hole VICH2.

The second vertical initialization line VVAIL may be connected to the second horizontal initialization line HVAIL through a third initialization contact hole VACH3. The second vertical initialization line VVAIL may be connected to the second electrode D4 of the fourth transistor ST4 through a fourth initialization contact hole VACH4.

A first initialization voltage may be applied to the first horizontal initialization line HVIL and the first vertical initialization line VVIL, and a second initialization voltage may be applied to the second horizontal initialization line HVAIL and the second vertical initialization line VVAIL.

Figure 7:
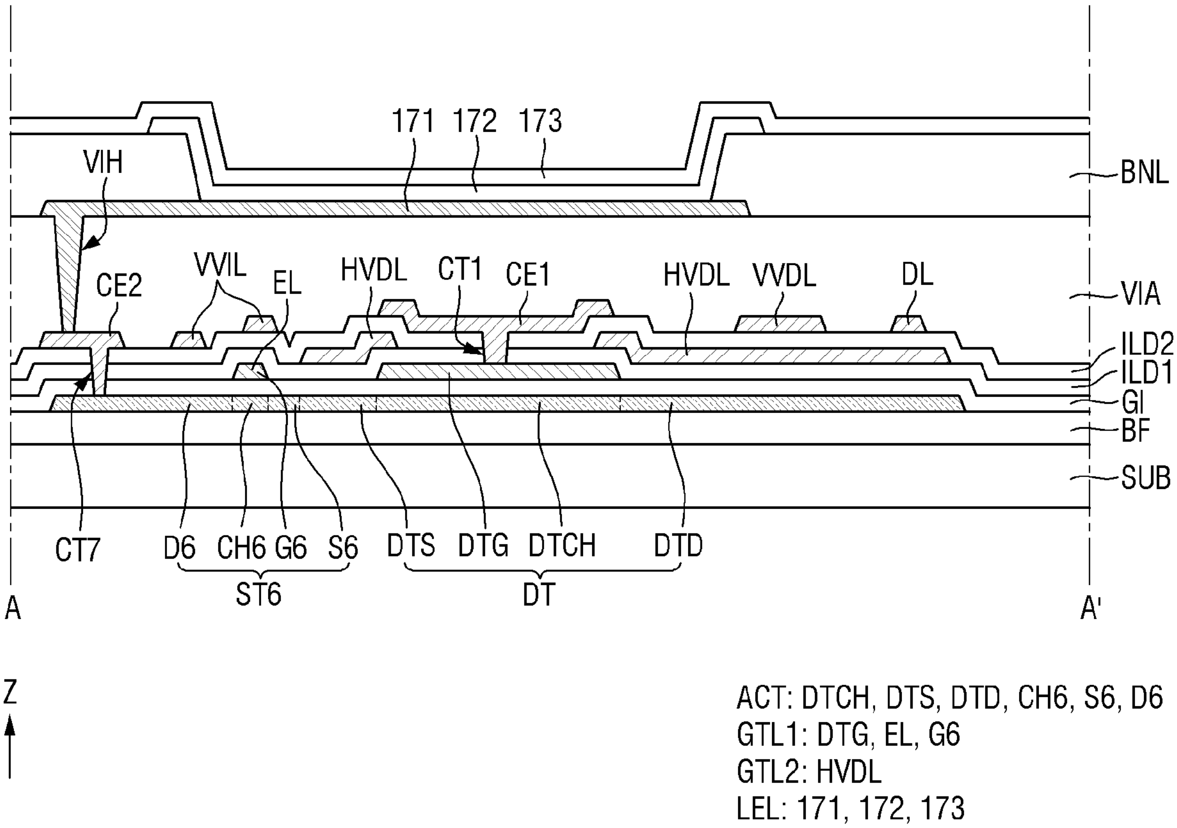
FIG. 7 is a cross-sectional view illustrating an example of the display panel taken along the line A-A' of FIG. 6 according to some embodiments.

FIG. 7 is a cross-sectional view illustrating an example of the display panel taken along the line A-A' of FIG. 6.

Referring to FIG. 7, a thin film transistor layer TFTL may be located on a substrate SUB. The thin film transistor layer TFTL may be a layer in which the driving transistor DT, the first to sixth transistors ST1 to ST6, and the capacitor CST are formed.

The display panel 100 may include a substrate SUB, an active layer ACT, a first gate metal layer GTL1, a second gate metal layer GTL2, and a data metal layer DTL. In addition, the display panel 100 may include a buffer layer BF, a gate insulating layer GI, a first interlayer insulating layer ILD1, a second interlayer insulating layer ILD2, and a via layer VIA.

A buffer layer BF may be located on one surface of the substrate SUB. The buffer layer BF may be formed on one surface of the substrate SUB to protect thin film transistors and an organic light emitting layer 172 of the light emitting element layer EML from moisture permeating through the substrate SUB, which is vulnerable to moisture permeation. The buffer layer BF may include a plurality of inorganic films that are alternately stacked. For example, the buffer layer BF may be formed as multiple films in which one or more inorganic films of a silicon nitride layer, a silicon oxynitride layer, a silicon oxide layer, a titanium oxide layer, and an aluminum oxide layer are alternately stacked. The buffer layer BF may be omitted.

The active layer ACT may be located on the buffer layer BF. The active layer ACT may include a silicon semiconductor such as polycrystalline silicon, single crystal silicon, low-temperature polycrystalline silicon, or amorphous silicon.

The driving transistor DT may include the channel layer DTCH, the first electrode DTS, and the second electrode DTD of the driving transistor DT. The channel layer DTCH of the driving transistor DT may be an area overlapping the gate electrode DTG of the driving transistor DT in the third direction (Z-axis direction) that is a thickness direction of the substrate SUB. The first electrode DTS of the driving transistor DT may be located on one side of the channel layer DTCH, and the second electrode DTD thereof may be located on the other side of the channel layer DTCH. The first electrode DTS and the second electrode DTD of the driving transistor DT may be areas that do not overlap the gate electrode DTG in the third direction (Z-axis direction). The first electrode DTS and the second electrode DTD of the driving transistor DT may be areas having conductivity by doping the silicon semiconductor with ions or impurities.

In addition, the active layer ACT may further include the channel layer CH6 of the sixth transistors ST6, the first electrode S6, and the second electrode D6. Each of the channel layers CH1 and CH4 to CH6 of the first and fourth to sixth transistors ST1 and ST4 to ST6 may overlap a corresponding gate electrode among the gate electrodes G1 and G4 to G6 in the third direction DR3. The first electrode S6 and the second electrode D6 of the sixth transistor ST6 may be areas having conductivity by doping the silicon semiconductor with ions or impurities.

A gate insulating layer GI may be located on the active layer ACT. The gate insulating layer GI may be formed as an inorganic film, for example, a silicon nitride layer, a silicon oxynitride layer, a silicon oxide layer, a titanium oxide layer, or an aluminum oxide layer.

The first gate metal layer GTL1 may be located on the gate insulating layer GI. The first gate metal layer GTL1 may include the gate electrode DTG of the driving transistor DT. In addition, the first gate metal layer GTL1 may further include the gate electrode G6 of the sixth transistor ST6 and the light emitting control line EL. According to some embodiments, the first gate metal layer GTL1 may further include a first capacitor electrode CAE1, scan write lines GWL, scan initialization lines GIL, and scan bias lines GBL. The first gate metal layer GTL1 may be formed as a single layer or multiple layers made of any one of molybdenum (Mo), aluminum (Al), chromium (Cr), gold (Au), titanium (Ti), nickel (Ni), neodymium (Nd), and copper (Cu), or alloys thereof.

The first interlayer insulating layer ILD1 may be located on the first gate metal layer GTL1. The first interlayer insulating layer ILD1 may be formed as an inorganic film, for example, a silicon nitride layer, a silicon oxynitride layer, a silicon oxide layer, a titanium oxide layer, or an aluminum oxide layer.

A second gate metal layer GTL2 may be located on the first interlayer insulating layer ILD1. The second gate metal layer GTL2 may include a horizontal driving voltage line HVDL. According to some embodiments, the second gate metal layer GTL2 may further include a first horizontal initialization line HVIL and a second horizontal initialization line HVAIL. The second gate metal layer GTL2 may be formed as a single layer or multiple layers made of any one of molybdenum (Mo), aluminum (Al), chromium (Cr), gold (Au), titanium (Ti), nickel (Ni), neodymium (Nd), and copper (Cu), or alloys thereof.

The second interlayer insulating layer ILD2 may be located on the second gate metal layer GTL2. The second interlayer insulating layer ILD2 may be formed as an inorganic film, for example, a silicon nitride layer, a silicon oxynitride layer, a silicon oxide layer, a titanium oxide layer, or an aluminum oxide layer.

The data metal layer DTL may be located on the second interlayer insulating layer ILD2. The data metal layer DTL may include the first and second connection electrodes CE1 and CE2, the vertical driving voltage line VVDL, and the first vertical initialization line VVIL. According to some embodiments, the data metal layer DTL may further include the second vertical initialization line VVAIL. The data metal layer DTL may be formed as a single layer or multiple layers made of any one of molybdenum (Mo), aluminum (Al), chromium (Cr), gold (Au), titanium (Ti), nickel (Ni), neodymium (Nd), and copper (Cu), or alloys thereof.

The first connection electrode CE1 may be connected to the gate electrode DTG of the driving transistor DT through the first contact hole CT1 penetrating through the first interlayer insulating layer ILD1 and the second interlayer insulating layer ILD2. The second connection electrode CE2 may be connected to the second electrode D6 of the sixth transistor ST6 through the seventh contact hole CT7 penetrating through the first interlayer insulating layer ILD1, the second interlayer insulating layer ILD2, and the gate insulating layer GI.

The via layer VIA for planarizing a step caused by the active layer ACT, the first gate metal layer GTL1, the second gate metal layer GTL2, and the data metal layer DTL may be located on the data metal layer DTL. The via layer VIA may be formed as an organic film such as an acrylic resin, an epoxy resin, a phenolic resin, a polyamide resin, or a polyimide resin.

A light emitting element LEL and a bank BNL may be located on the via layer VIA. The light emitting element LEL may include a pixel electrode 171, an organic light emitting layer 172, and a common electrode 173.

The pixel electrode 171 may be located on the via layer VIA. The pixel electrode 171 may connect the via layer VIA to the second connection electrode CE2 through a pixel contact hole VIH. The pixel electrode 171 may include a metal material having high reflectance, such as aluminum, titanium, ITO, or an APC alloy. The APC alloy is an alloy of silver (Ag), palladium (Pd), and copper (Cu). The pixel electrode 171 may be formed in, for example, a stacked structure (Ti/Al/Ti) of aluminum and titanium, a stacked structure (ITO/AI/ITO) of aluminum and ITO, and a stacked structure (ITO/APC/ITO) of an APC alloy and ITO, and the like.

The bank BNL may be a pixel defining film or a light emitting portion defining film that defines a light emitting area. The bank BNL may partition the light emitting area. The light emitting area refers to an area in which the pixel electrode 171, the organic light emitting layer 172, and the common electrode 173 are sequentially stacked and holes from the pixel electrode 171 and electrons from the common electrode 173 are recombined with each other in the organic light emitting layer 172 to emit light.

The bank BNL may be formed to cover an edge of the pixel electrode 171 of the light emitting element LEL. The bank BNL may be formed as an organic film made of an acryl resin, an epoxy resin, a phenolic resin, a polyamide resin, a polyimide resin, or the like.

The organic light emitting layer 172 may be located on the pixel electrode 171. The organic light emitting layer 172 may include an organic material to emit light of a color (e.g., a set or predetermined color). For example, the organic light emitting layer 172 may include a hole transporting layer, an organic material layer, and an electron transporting layer.

The common electrode 173 may be located on the organic light emitting layer 172 and the bank BNL. The common electrode 173 may be formed to cover the organic light emitting layer 172. The common electrode 173 may be commonly formed in the light emitting areas.

In a top emission structure, the common electrode 173 may be formed of a transparent conductive material (TCO) such as ITO or indium zinc oxide (IZO) capable of transmitting light, or a semi-transmissive conductive material such as magnesium (Mg), silver (Ag), or an alloy of magnesium (Mg) and silver (Ag). When the common electrode 173 is formed of the semi-transmissive conductive material, light emitting efficiency may be increased by a micro cavity.

Figure 8:
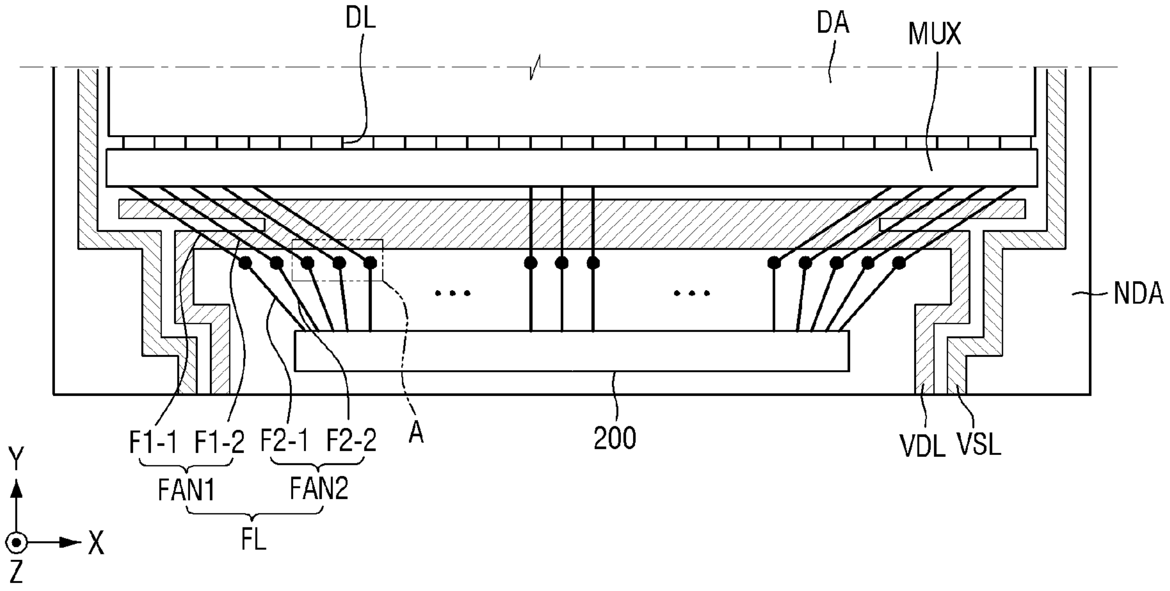
FIG. 8 is a plan view illustrating a non-display area of the display panel according to some embodiments.
Figure 9:
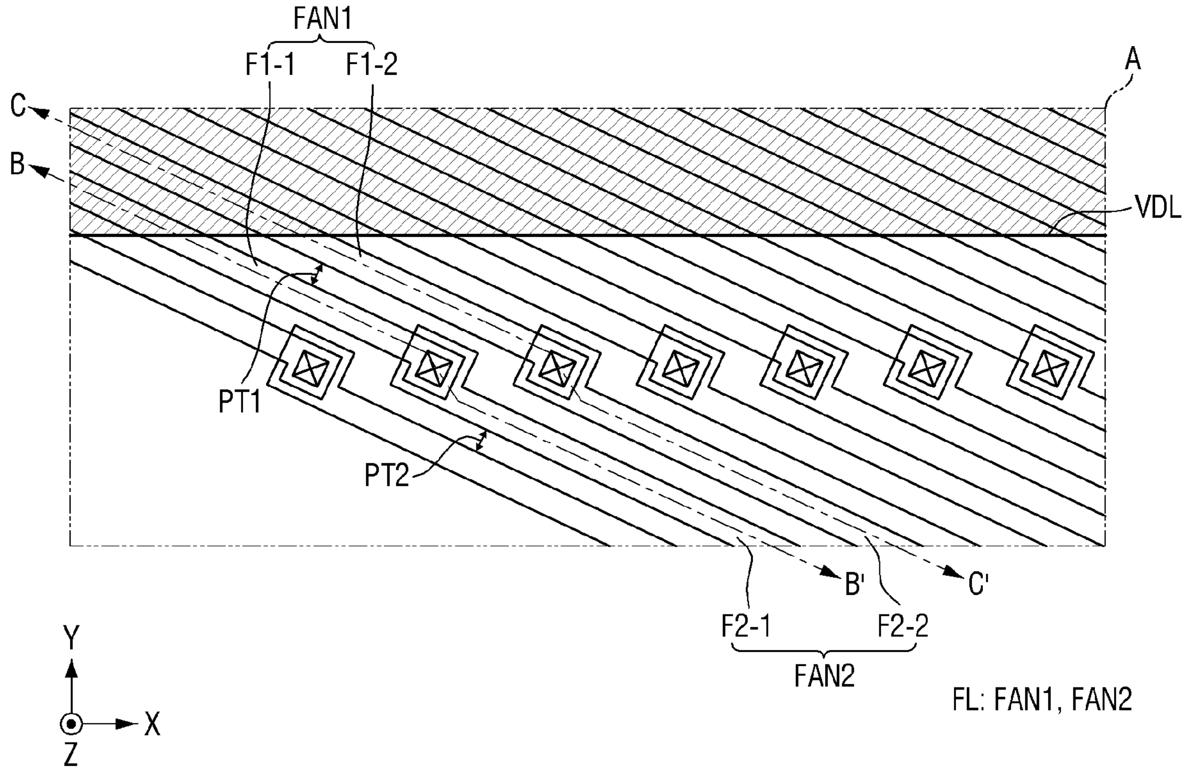
FIG. 9 is a plan view illustrating an enlarged example of the area A of FIG. 8 according to some embodiments.
Figure 10:
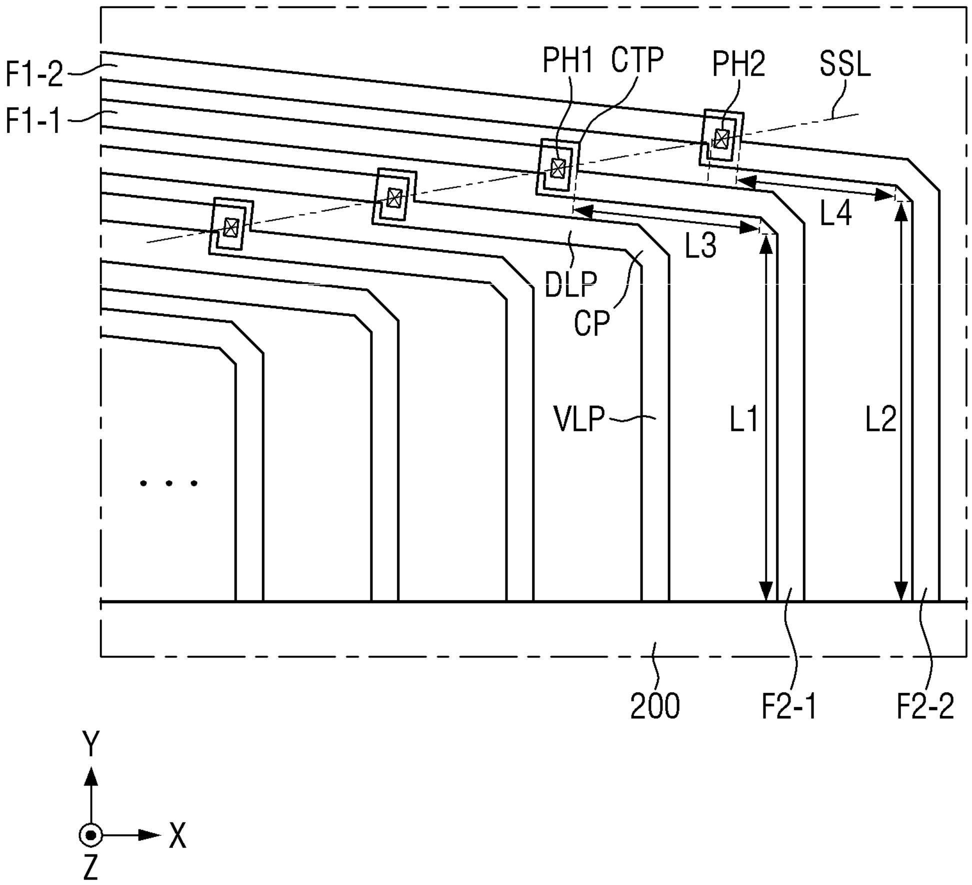
FIG. 10 is a plan view illustrating another enlarged example of the area A of FIG. 8 according to some embodiments.
Figure 11:
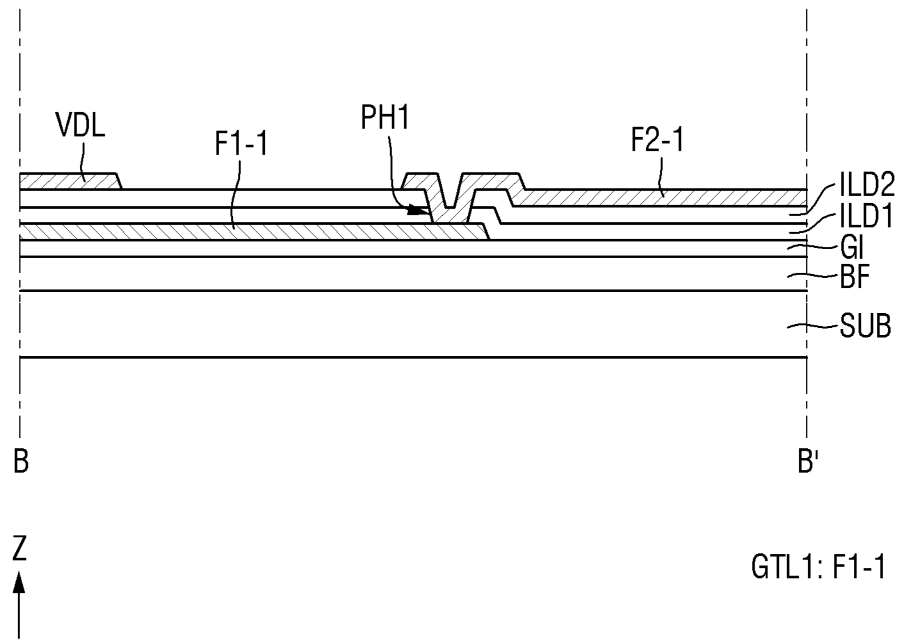
FIG. 11 is a cross-sectional view illustrating the display panel taken along the line B-B' of FIG. 9 according to some embodiments.
Figure 12:
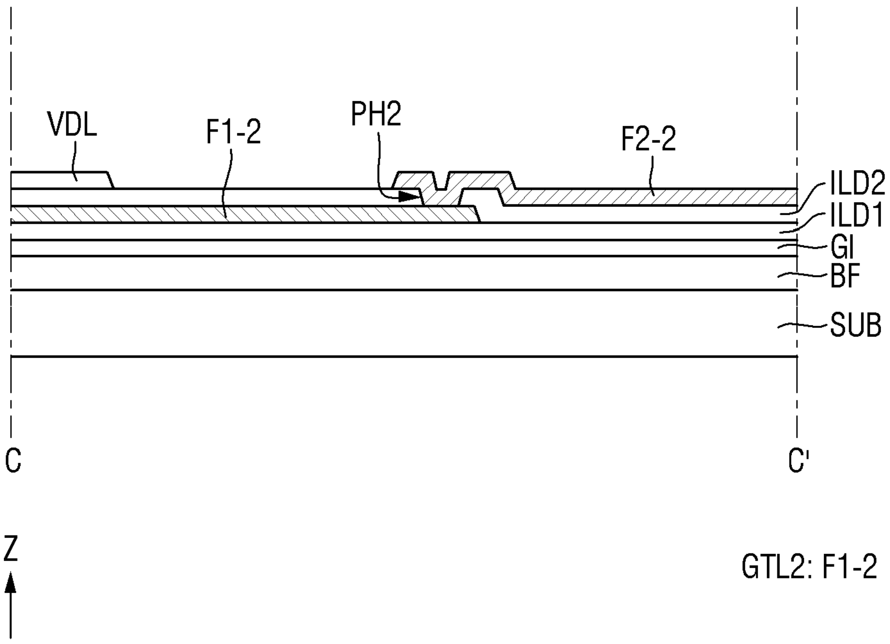
FIG. 12 is a cross-sectional view illustrating the display panel taken along the line C-C' of FIG. 9 according to some embodiments.

FIG. 8 is a plan view illustrating a non-display area of the display panel according to some embodiments. FIG. 9 is a plan view illustrating an enlarged example of area A of FIG. 8. FIG. 10 is a plan view illustrating another enlarged example of area A of FIG. 8. FIG. 11 is a cross-sectional view illustrating the display panel taken along the line B-B' of FIG. 9. FIG. 12 is a cross-sectional view illustrating the display panel taken along the line C-C' of FIG. 9.

Referring to FIGS. 8 and 12, the display panel 100 may include a non-display area NDA located on one side, for example, a lower side of the display area DA. The non-display area NDA may include a multiplexer MUX located on a lower side of the display area DA, a display driving circuit 200 located on a lower side of the multiplexer MUX, a plurality of fan-out lines FL connected to the multiplexer MUX and the display driving circuit 200, respectively, a driving voltage line VDL, and a low potential line VSL.

The multiplexer MUX may be a demultiplexer (Demux), and may be located between the display area DA and the display driving circuit 200. The multiplexer MUX may include a plurality of transistors, and may receive one data signal and select one of a plurality of data lines DL to transmit the data signal.

The data lines DL may input data signals to a plurality of sub-pixels located in the display area DA. The data lines DL may extend between the display area DA and the multiplexer MUX, and may extend in the second direction (Y-axis direction).

The driving voltage line VDL may be located in the non-display area NDA on the lower side of the display area DA. The driving voltage line VDL may transmit the driving voltage applied from the circuit board ('300' in FIG. 1) to the display area DA. The driving voltage line VDL may be located between the multiplexer MUX and the display driving circuit 200.

The low potential line VSL may be located in the non-display area NDA around the display area DA. The low potential line VSL may be located at an edge of the display panel 100. The driving voltage line VDL may transmit the driving voltage applied from the circuit board ('300' in FIG. 1) to the display area DA.

The fan-out lines FL may be located between the multiplexer MUX and the display driving circuit 200 in the non-display area NDA. The fan-out lines FL may include a first fan-out line FAN1 and a second fan-out line FAN2. The first fan-out line FAN1 may include a first-first fan-out line F1-1 and a first-second fan-out line F1-2. The first-first fan-out line F1-1 and the first-second fan-out line F1-2 may generally extend in a direction toward the display driving circuit 200, and may be alternately arranged along the first direction (X-axis direction). The second fan-out line FAN2 may include a second-first fan-out line F2-1 and a second-second fan-out line F2-2. The second-first fan-out line F2-1 and the second-second fan-out line F2-2 may generally extend in the direction toward the display driving circuit 200, and may be alternately arranged along the first direction (X-axis direction).

The fan-out lines FL may be connected to each other through a contact hole. The first fan-out line FAN1 may be connected to the second fan-out line FAN2 through the contact hole. For example, the first-first fan-out line F1-1 may be connected to the second-first fan-out line F2-2 through a contact hole PH1, and the first-second fan-out line F1-2 may be connected to the second-second fan-out line F2-2 through a contact hole PH2

The first fan-out line FAN1 may have one end connected to the multiplexer MUX and the other end connected to the second fan-out line FAN2. The first-first fan-out line F1-1 and the first-second fan-out line F1-2 may be made of different conductive layers and may be alternately arranged. The first-first fan-out line F1-1 and the first-second fan-out line F1-2 may be made of different conductive layers to reduce a pitch therebetween. For example, the first-first fan-out line F1-1 may be made of the first gate metal layer ('GTL1' in FIG. 7), and the first-second fan-out line F1-2 may be made of the second gate metal layer ('GTL2' in FIG. 7). However, the present disclosure is not limited thereto, and the first-first fan-out line F1-1 may also be made of the second gate metal layer ('GTL2' in FIG. 7), and the first-second fan-out line F1-2 may also be made of the first gate metal layer ('GTL1 in FIG. 7)

The second fan-out line FAN2 may have one end connected to the first fan-out line FAN1 and the other end electrically connected to the display driving circuit 200. The second-first fan-out line F2-1 and the second-second fan-out line F2-2 may be made of the same conductive layer and may be alternately arranged. The second-first fan-out line F2-1 and the second-second fan-out line F2-2 may be made of the data metal layer ('DTL' in FIG. 7).

The above-described fan-out lines FL may be spaced apart from each other at the same distance. For example, the first fan-out lines FAN1 may be spaced apart from each other at the same distance, and the second fan-out lines FAN2 may be spaced apart from each other at the same distance. For example, the first-first fan-out line F1-1 and the first-second fan-out line F1-2 may be alternately spaced apart from each other at the same first interval PT1. In addition, the second fan-out lines FAN2 may be spaced apart from each other at the same distance. For example, the second-first fan-out line F2-1 and the second-second fan-out line F2-2 may be alternately spaced apart from each other at the same second interval PT2. Accordingly, the fan-out lines FL may be relatively efficiently arranged.

The driving voltage line VDL may overlap the fan-out lines FL described above. The driving voltage line VDL may be made of the data metal layer ('DTL' in FIG. 7). The driving voltage line VDL may be located on the same layer as the second fan-out lines FAN2 and on a different layer from the first fan-out lines FAN1. The driving voltage line VDL may overlap the first fan-out lines FAN1 located on different layers. The driving voltage line VDL may be spaced apart from and not overlap the second fan-out line FAN2 located on the same layer.

As illustrated in FIG. 10, according to some embodiments, at least two second fan-out lines FAN2 may include portions extending in the first direction (X-axis direction) and the second direction (Y-axis direction). For example, the at least two second fan-out lines FAN2 may be formed in a shape that extends in the first direction (X-axis direction) and is then bent in the second direction (Y-axis direction)

For example, at least two second fan-out lines FAN2 may include a contact portion CTP connected to the first fan-out lines FAN1, a first area DLP extending from the contact portion CTP, a second area VLP extending in a vertical direction, and a connection portion CP connecting the first area DLP and the second area VLP.

The contact portion CTP may be an area in which the contact holes PH1 and PH2 are arranged to overlap the first fan-out line FAN1. The contact portion CTP may be an area having a width greater than an average width of the second fan-out lines FAN2.

The first area DLP may be an area extending in the first direction (X-axis direction) from the contact portion CTP. The first area DLP may extend in parallel to the first fan-out lines FAN1 and may be arranged such that it is spaced apart from the first area DLP of the adjacent second fan-out line FAN2 in the second direction (Y-axis direction).

The second area VLP may be an area extending in the second direction (Y-axis direction) perpendicular to the first direction (X-axis direction). The second area VLP may be connected to the display driving circuit 200 to extend from the display driving circuit 200 in the second direction (Y-axis direction). The second area VLP may be arranged such that it is spaced apart from the second areas VLP of the adjacent second fan-out lines FAN2 in the first direction (X-axis direction) but may be arranged parallel thereto.

The connection portion CP may be located between the first area DLP and the second area VLP to connect the first area DLP and the second area VLP. The connection portion CP may be a bent portion between the first area DLP and the second area VLP.

A length of the first area DLP and a length of the second area VLP of the second fan-out line FAN2 may be different from each other. The first area DLP is a portion extending from the first fan-out lines FAN1, and the second area VLP, which is a portion extending from the display driving circuit 200, may have different lengths depending on an arrangement thereof.

The lengths of the first fan-out lines FAN1 extending to the display driving circuit 200 may be different from each other. For example, the lengths of the first fan-out line FAN1 extending from a portion far from the display driving circuit 200 and the first fan-out line FAN1 extending from a portion close to the display driving circuit 200 may be different from each other. That is, line resistances between the first fan-out lines FAN1 may be different from each other. According to the present disclosure, a variation in the line resistances between the fan-out lines FL may be minimized or reduced by arranging the lengths of the second fan-out lines FAN2 connected to the first fan-out lines FAN1 to be different from each other.

According to some embodiments, in order to reduce the variation in the line resistances between the fan-out lines FL, at least two second fan-out lines FAN2 may have the second areas VLP having different lengths and the first areas DLP having different lengths. For example, at least two second fan-out lines FAN2 may include the first area DLP having a decreasing length and the second area VLP having an increasing length toward the center of the display area DA. For example, a length of the first area DLP of the second-second fan-out line F2-2 may be smaller than a length of the first area DLP of the second-first fan-out line F2-1. In addition, a length of the second area VLP of the second-second fan-out line F2-2 may be greater than a length of the second area VLP of the second-first fan-out line F2-1.

As the lengths of the second fan-out lines FAN2 are different, the arrangement of the contact holes PH1 and PH2 to which the first fan-out lines FAN1 and the second fan-out lines FAN2 are connected may be different. For example, at least some of the contact holes PH1 and PH2 may be arranged to be spaced apart from each other in the first direction (X-axis direction), and may be arranged to be spaced apart from each other in the second direction (Y-axis direction) toward the center of the display area DA. For example, a virtual line SSL connecting the centers of the contact holes PH1 and PH2 may pass between the first direction (X-axis direction) and the second direction (Y-axis direction). According to some embodiments, the virtual line SSL may have an oblique shape.

As illustrated in FIGS. 11 and 12, the first-first fan-out line F1-1 and the second-first fan-out line F2-1 may be located on different layers, and the first-second fan-out line F1-2 and the second-second fan-out line F2-2 may be located on different layers. Although FIGS. 10 and 11 illustrate that the first-first fan-out line F1-1 is made of the first gate metal layer GTL1 and the first-second fan-out line F1-2 is made of the second gate metal layer GTL2 as an example, the present disclosure is not limited thereto. The first-first fan-out line F1-1 may also be made of the second gate metal layer GTL2 and the first-second fan-out line F1-2 may also be made of the first gate metal layer GTL1

For example, the buffer layer BF and the gate insulating layer GI may be located on the substrate SUB, and the first-first fan-out line F1-1 may be located on the gate insulating layer GI. The first-first fan-out line F1-1 may be made of the first gate metal layer GTL1. The first interlayer insulating layer ILD1 may be located on the first-first fan-out line F1-1.

The first-second fan-out line F1-2 may be located on the first interlayer insulating layer ILD1. The first-second fan-out line F1-2 may be made of the second gate metal layer GTL2. The first-first fan-out line F1-1 and the first-second fan-out line F1-2 may be located on different layers and spaced apart from each other with the first interlayer insulating layer ILD1 interposed therebetween. The second interlayer insulating layer ILD2 may be located on the first-second fan-out line F1-2.

The second fan-out lines FAN2 and the driving voltage line VDL may be located on the second interlayer insulating layer ILD2. The second-first fan-out line F2-1 may be connected to the first-first fan-out line F1-1 through the first contact hole PH1 penetrating through the first interlayer insulating layer ILD1 and the second interlayer insulating layer ILD2. The second-second fan-out line F2-2 may be connected to the first-second fan-out line F1-2 through the second contact hole PH2 penetrating through the second interlayer insulating layer ILD2.

The second fan-out line FAN2 and the driving voltage line VDL may be located on the same layer and arranged to be spaced apart from each other. The second fan-out line FAN2 and the driving voltage line VDL may be made of the data metal layer DTL.

According to some embodiments, the fan-out line FL may include a first fan-out line FAN1 and a second fan-out line FAN2 made of different materials. The fan-out line FL may include the data metal layer DTL having lower resistance than the first and second gate metal layers GTL1 and GTL2 to reduce line resistance. For example, the first fan-out line FAN1 may be formed of the first and second gate metal layers GTL1 and GTL2 to prevent or reduce interference with the driving voltage line VDL, and the second fan-out line FAN2 may be formed of the data metal layer DTL having relatively low resistance in an area that does not interfere with the driving voltage line VDL. Accordingly, the line resistance of the fan-out lines FL may be reduced.

Table 1 below illustrates results of measuring resistance of the fan-out line FL according to Example and Comparative Example. Here, in Example, the fan-out lines were manufactured in a structure of the first fan-out line made of the first and second gate metal layers and the second fan-out line made of the data metal layer (FIGS. 8 to 11). In Comparative Example, the fan-out lines FL were manufactured using the first and second gate metal layers without the second fan-out line.

TABLE 1

| | Comparative Example | Example |
|---|---|---|
| Fan-Out Line Resistance (ohm) | 2050 | 1650 |

Referring to Table 1, the fan-out lines of Comparative Example made of the gate metal layers exhibited resistance of 2050Ω, while the fan-out lines of Example including the second fan-out line made of the data metal layer exhibited resistance of 1650Ω. Therefore, the resistance of about 400Ω was reduced.

In order to drive the multiplexer MUX included in the display device 10 at 120 Hz, low resistance of the fan-out lines is required. According to some embodiments, because the resistance of the fan-out lines may be reduced by about 20% compared to the comparative example, it may be possible to drive the multiplexer MUX at 120 Hz.

Hereinafter, other embodiments of the display device will be described with reference to other drawings.

Figure 13:
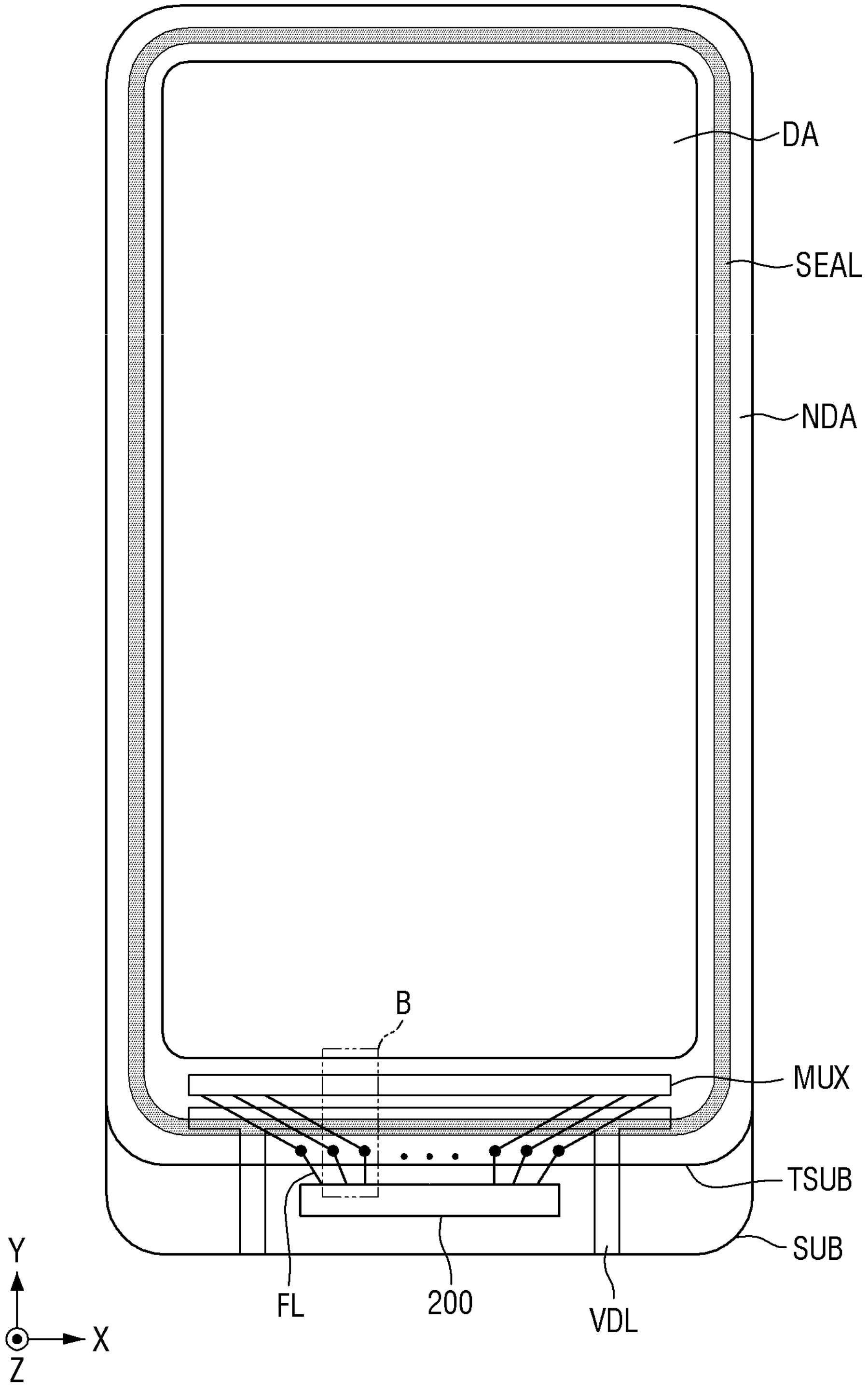
FIG. 13 is a plan view illustrating a display device according to some embodiments.
Figure 14:
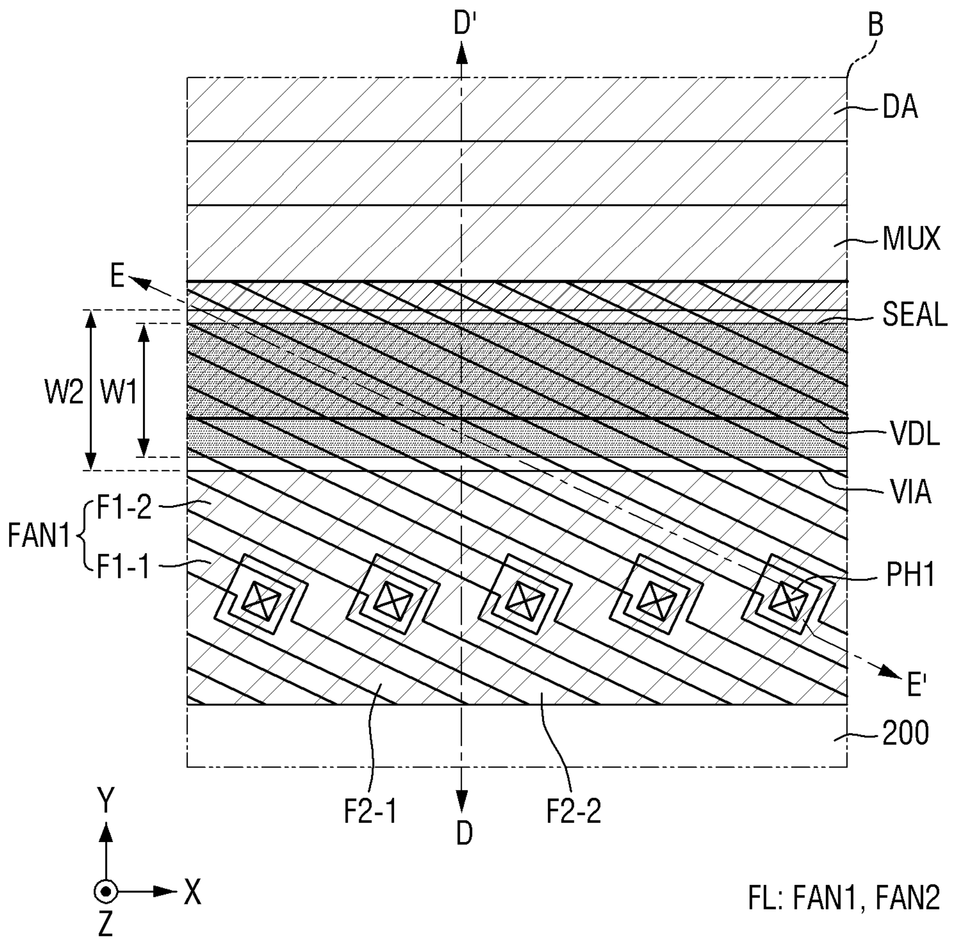
FIG. 14 is an enlarged plan view of the area B of FIG. 13 according to some embodiments.
Figure 15:
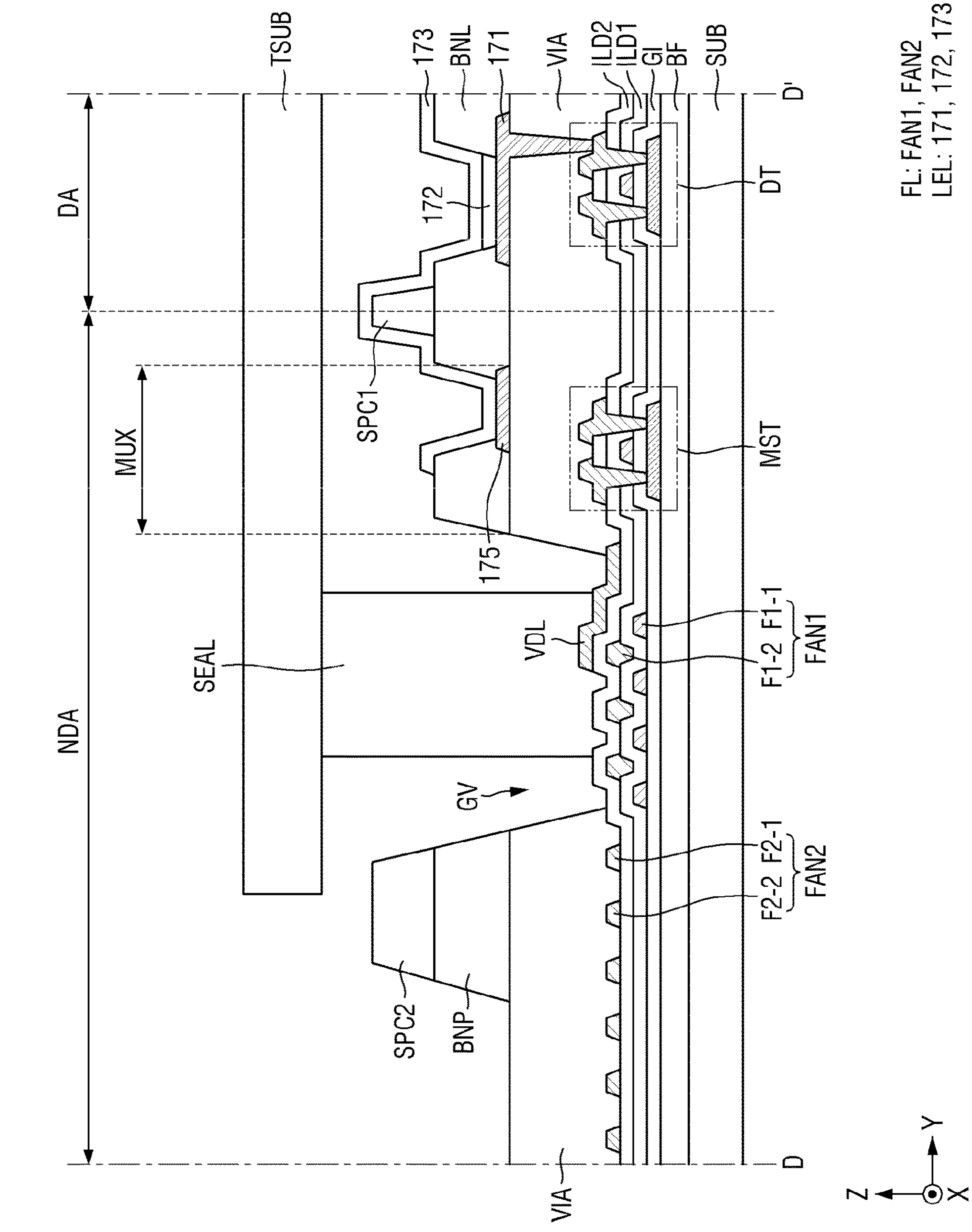
FIG. 15 is a cross-sectional view illustrating the display panel taken along the line D-D' of FIG. 14 according to some embodiments.
Figure 16:
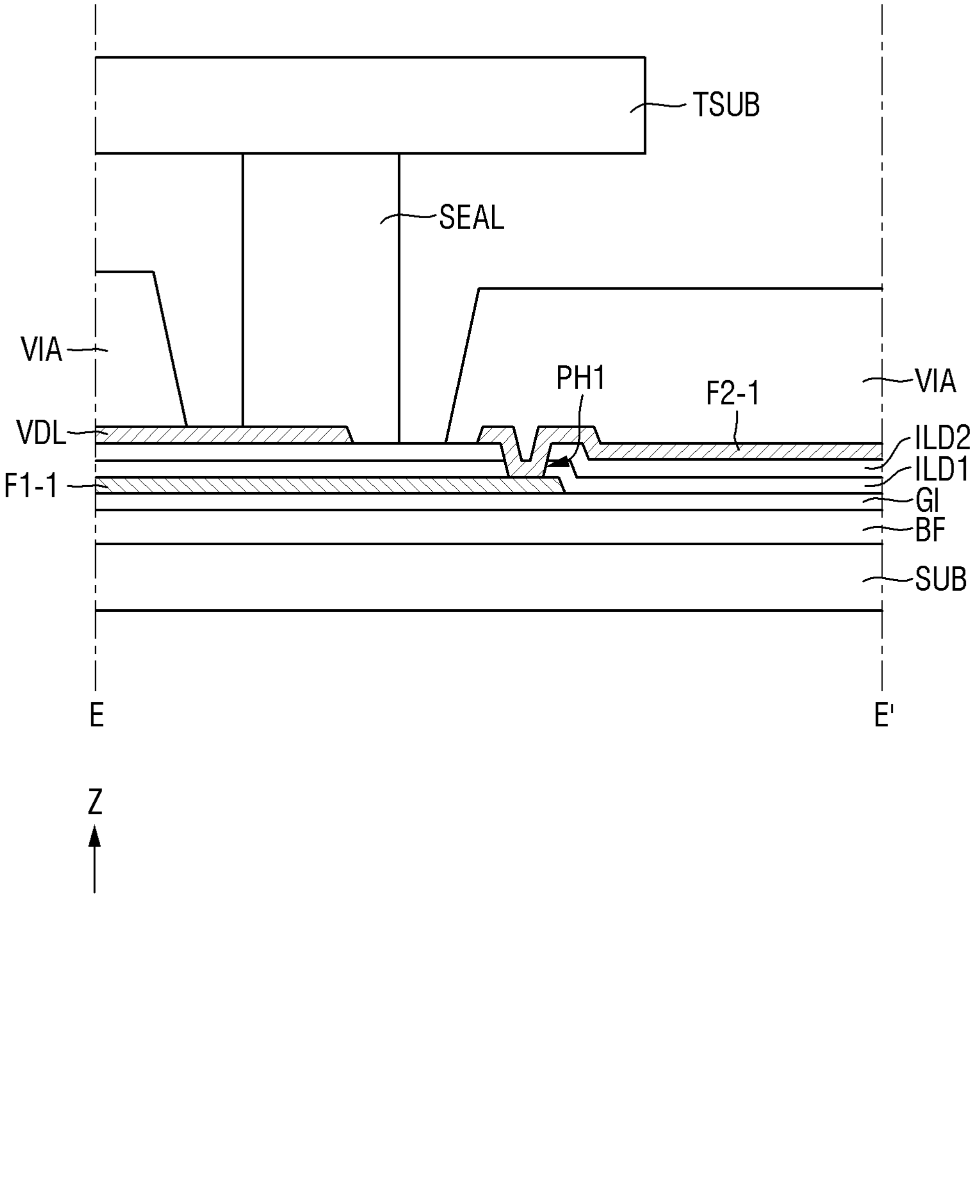
FIG. 16 is a cross-sectional view illustrating the display panel taken along the line E-E' of FIG. 14 according to some embodiments.

FIG. 13 is a plan view illustrating a display device according to some embodiments. FIG. 14 is an enlarged plan view of area B of FIG. 13. FIG. 15 is a cross-sectional view illustrating the display panel taken along the line D-D' of FIG. 14. FIG. 16 is a cross-sectional view illustrating the display panel taken along the line E-E' of FIG. 14.

The embodiments illustrated and described with respect to FIGS. 13 to 16, are different from the embodiments illustrated and described with respect to FIGS. 8 to 11 in that the display panel 100 further includes an encapsulation substrate TSUB facing the substrate SUB and a coupling member SEAL for bonding the substrate SUB and the encapsulation substrate TSUB to each other. Hereinafter, some descriptions overlapping or repetitive with respect to the above-described embodiments may be omitted and differences from the above-described embodiments will mainly be described.

In the display panel 100, the substrate SUB including the display area DA and the non-display area NDA may be bonded to the encapsulation substrate TSUB. The encapsulation substrate TSUB may be a transparent substrate through which light may transmit, but is not limited thereto.

The substrate SUB and the encapsulation substrate TSUB may be coupled and bonded to each other through the coupling member SEAL. The coupling member SEAL may surround the display area DA of the substrate SUB and may be located in the non-display area NDA. For example, the coupling member SEAL may be formed in a closed loop shape completely surrounding the display area DA.

A driving transistor DT and a light emitting element LEL connected to the driving transistor DT may be located in the display area DA of the substrate SUB. A first spacer SPC1 may be located on the bank BNL in which the light emitting element LEL is arranged to maintain a gap with a mask when the organic light emitting layer 172 is manufactured. The first spacer SPC1 may be formed in the same process as the bank BNL, but is not limited thereto.

According to some embodiments, a multiplexer MUX, fan-out lines FL, and a driving voltage line VDL may be located in the non-display area NDA of the substrate SUB.

The multiplexer MUX may include a plurality of multi-transistors MST. The multi-transistors MST may include an active layer, a gate electrode, a first electrode, and a second electrode. The via layer VIA may extend from the display area DA and be arranged to extend to an upper side of the multiplexer MUX. A cathode contact electrode 175 for applying a low potential voltage to a cathode electrode 173 of the light emitting element LEL may be located on the via layer VIA. The bank BNL may extend to the non-display area NDA and expose the cathode contact electrode 175 to connect the cathode electrode 173 of the light emitting element LEL and the cathode contact electrode 175.

The fan-out lines FL may be located in the non-display area NDA of the substrate SUB. For example, the first fan-out lines FAN1 may be located adjacent to the display area DA, and the second fan-out lines FAN2 may be arranged to be spaced apart from the display area DA with the first fan-out lines FAN1 interposed therebetween. The first-first fan-out line F1-1 among the first fan-out lines FAN1 may be located on the gate insulating layer GI, and the first-second fan-out line F1-2 thereof may be located on the first interlayer insulating layer ILD1. The second fan-out lines FAN2 may be located on the second interlayer insulating layer ILD2.

The driving voltage line VDL may be located between the multiplexer MUX and the second fan-out lines FAN2. The driving voltage line VDL may be located on the second interlayer insulating layer ILD2 and may be located to be spaced apart from the second fan-out lines FAN2. The driving voltage line VDL may be arranged so as to not overlap the second fan-out lines FAN2, and may be arranged to overlap the first fan-out lines FAN1. In addition, the driving voltage line VDL may be arranged to overlap the via layer VIA and the coupling member SEAL.

The via layer VIA extending from the display area DA to the non-display area NDA may be arranged to overlap each of the driving voltage line VDL, the first fan-out line FAN1, and the second fan-out line FAN2. According to some embodiments, the via layer VIA may include a groove GV exposing a portion of the driving voltage line VDL and a portion of the first fan-out line FAN1 in the non-display area NDA. The groove GV may be arranged to surround the display area DA. As will be described later, the groove GV may secure an area where the coupling member SEAL may be in contact with the driving voltage line VDL and the second interlayer insulating layer ILD2 to increase adhesive characteristics of the coupling member SEAL.

A bank pattern BNP and a second spacer SPC2 may be located on an area of the via layer VIA that overlaps the second fan-out line FAN2. The bank pattern BNP may include the same material as the bank BNL, and the second spacer SPC2 may include the same material as the first spacer SPC1. The bank pattern BNP and the second spacer SPC2 may prevent or reduce damage to the substrate SUB during a scribing process of the encapsulation substrate TSUB.

The encapsulation substrate TSUB may be located on the substrate SUB, and the encapsulation substrate TSUB may be coupled to the substrate SUB through the coupling member SEAL. The coupling member SEAL may be in direct contact with the driving voltage line VDL and the second interlayer insulating layer ILD2 located on the substrate SUB through the groove GV of the via layer VIA. The coupling member SEAL may not overlap the via layer VIA and may be arranged to overlap the groove GV of the via layer VIA. According to some embodiments, a width W1 of the coupling member SEAL in the second direction (Y-axis direction) is formed to be smaller than a width W2 of the groove GV of the via layer VIA, so that an adhesive force of the coupling member SEAL may be secured.

The coupling member SEAL may overlap the first fan-out line FAN1. For example, the coupling member SEAL may overlap the first-first fan-out line F1-1 and the first-second fan-out line F1-2. The coupling member SEAL may be arranged so as not to overlap the second fan-out line FAN2. Because the second fan-out line FAN2 is located on the second interlayer insulating layer ILD2 unlike the first fan-out line FAN1, the second fan-out line FAN2 is in direct contact with the coupling member SEAL when overlapping the coupling member SEAL. In this case, when the coupling member SEAL is cured by a laser, high heat of the laser may be transmitted to the second fan-out line FAN2, thereby damaging the second fan-out line FAN2. According to some embodiments, by arranging the second fan-out line FAN2 so as not to overlap the coupling member SEAL, the damage to the second fan-out line FAN2 may be prevented or reduced.

Figure 17:
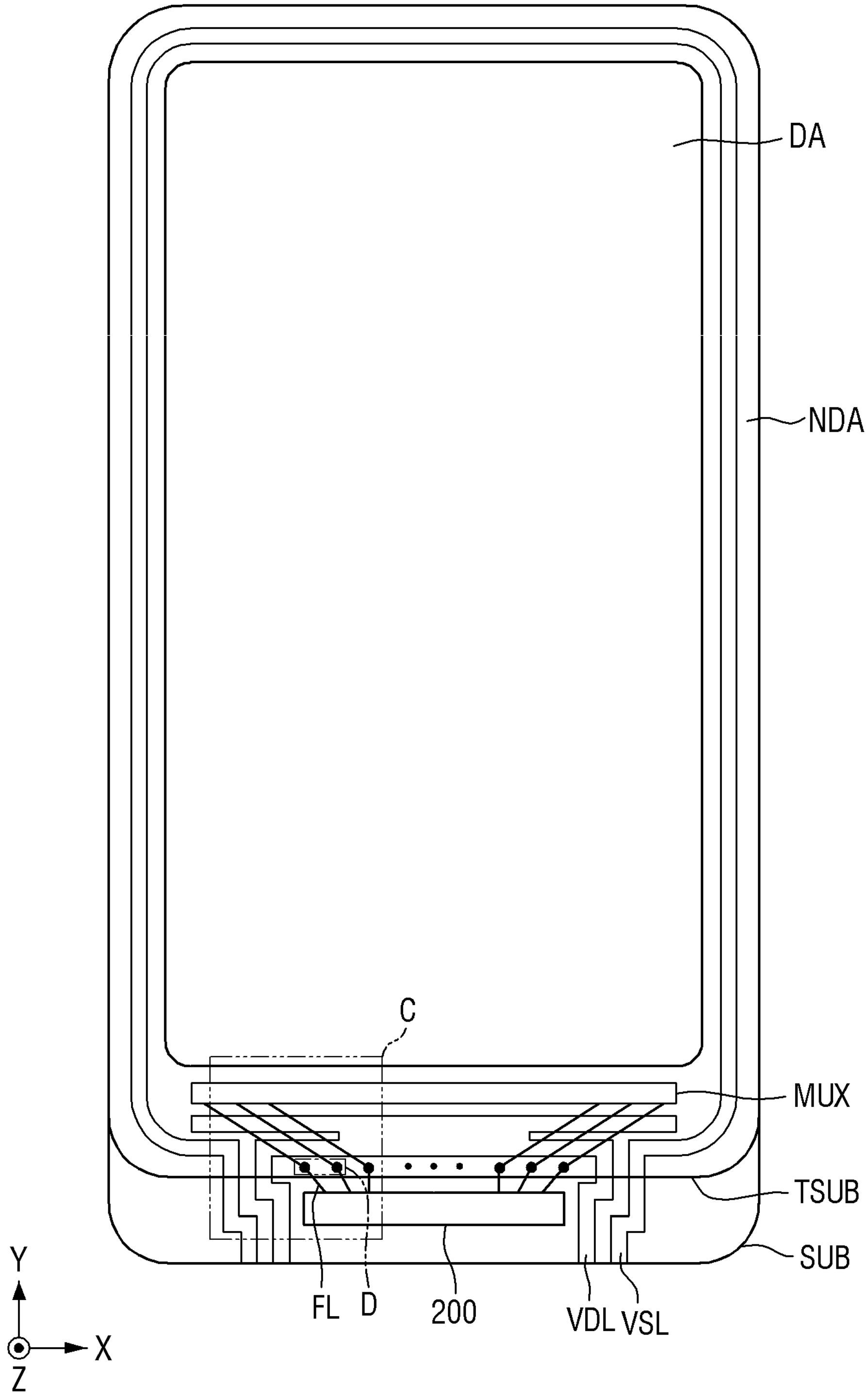
FIG. 17 is a plan view of a display pad according to some embodiments.
Figure 18:
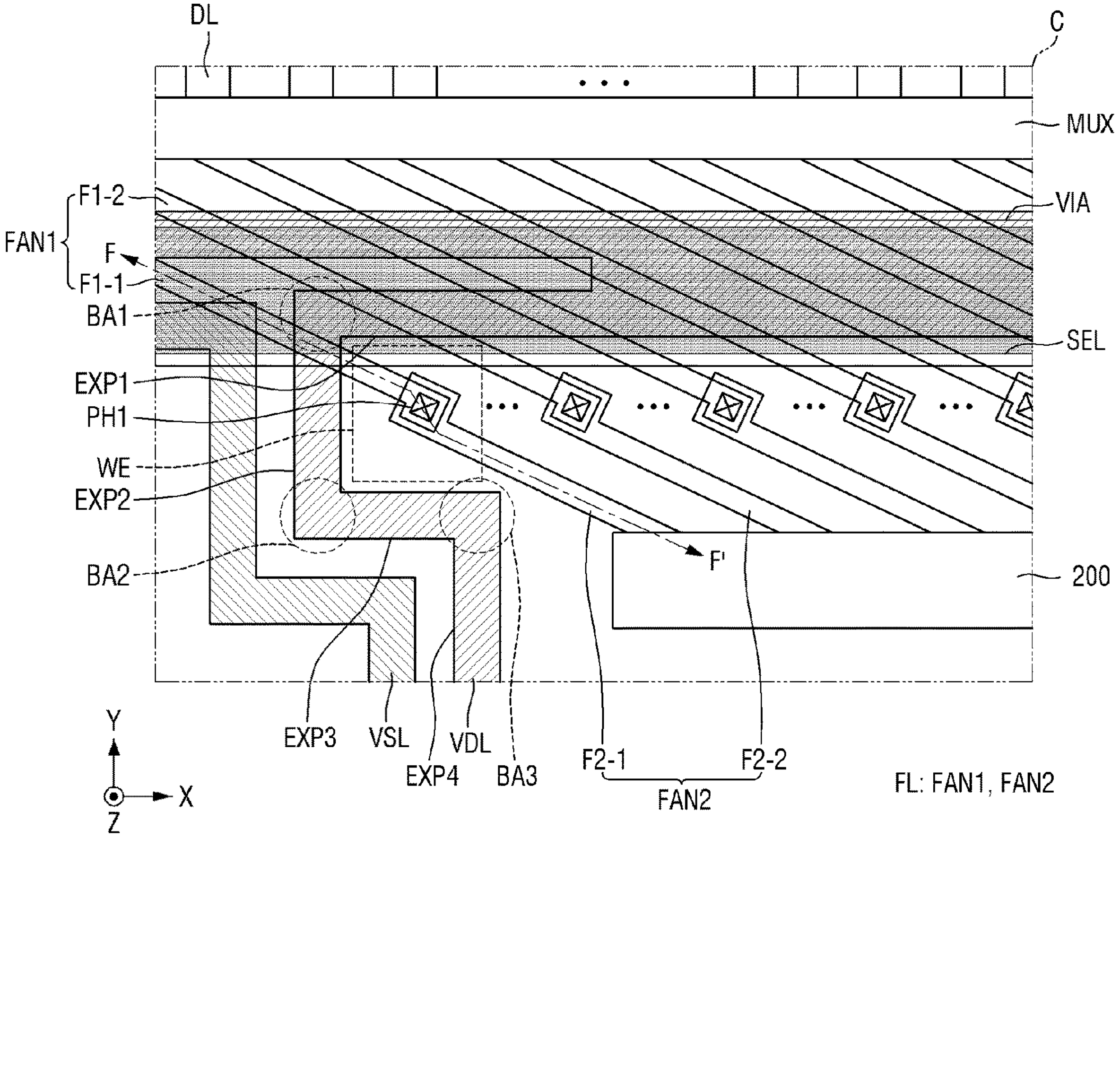
FIG. 18 is an enlarged plan view of the area C of FIG. 17 according to some embodiments.
Figure 19:
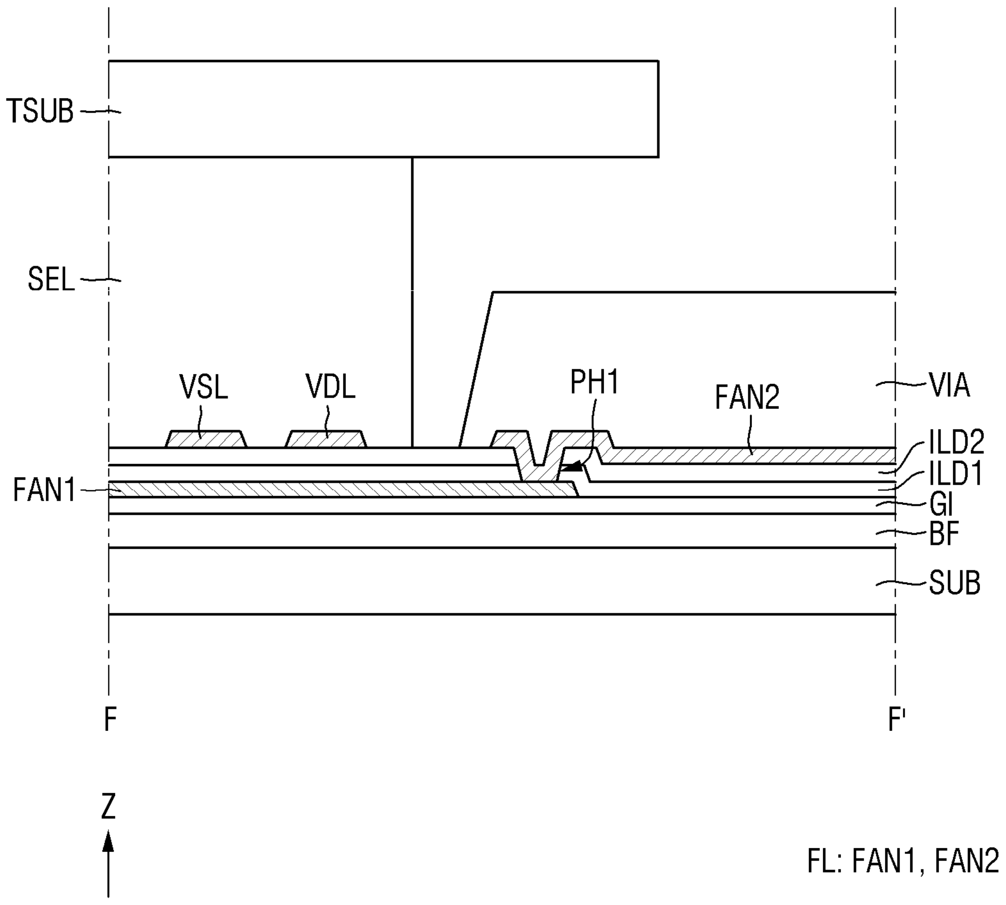
FIG. 19 is a cross-sectional view illustrating the display panel taken along the line F-F' of FIG. 17 according to some embodiments.
Figure 20:
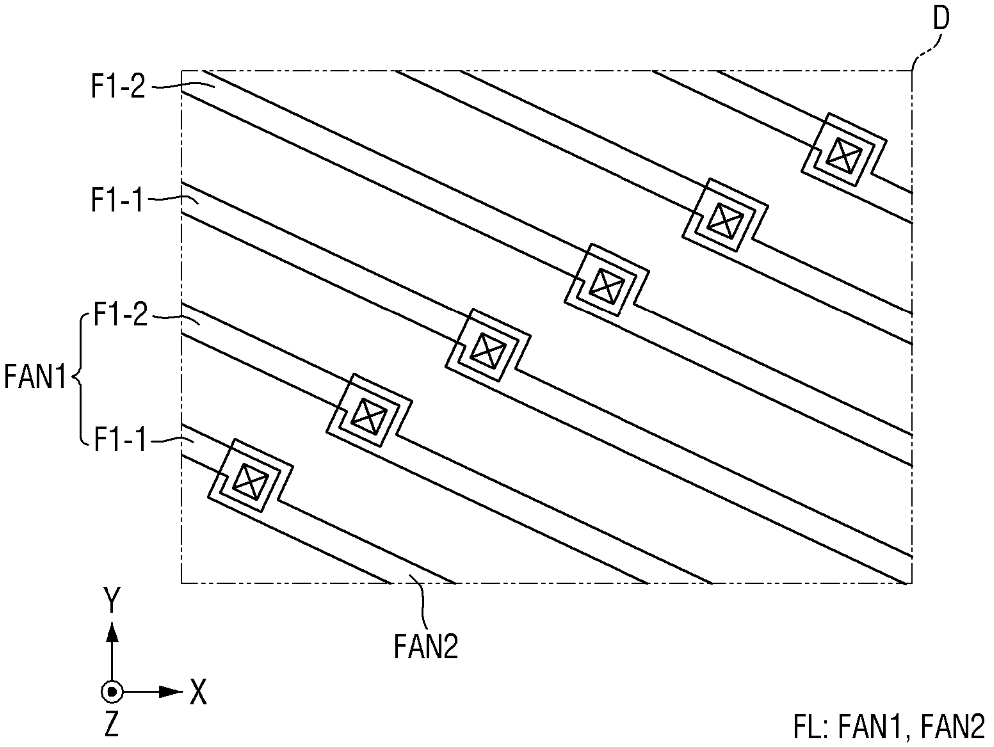
FIG. 20 is an enlarged plan view of the area D of FIG. 17 according to some embodiments.

FIG. 17 is a plan view of a display pad according to some embodiments. FIG. 18 is an enlarged plan view of area C of FIG. 17. FIG. 19 is a cross-sectional view illustrating the display panel taken along the line F-F' of FIG. 17. FIG. 20 is an enlarged plan view of area D of FIG. 17.

Referring to FIGS. 17 to 20, according to some embodiments, the display panel 100 may have bent portions of the driving voltage line VDL, and contact holes PH1 and PH2 of the fan-out line FL may be located in the bent portions. The contact holes PH1 and PH2 connecting the first fan-out line FAN1 and the second fan-out line FAN2 may be adjacent to the display area DA from an outer portion to a central portion of the display area DA. Hereinafter, some descriptions overlapping or repetitive with respect to the above-described embodiments may be omitted and differences from the above-described embodiments will mainly be described.

According to some embodiments, a multiplexer MUX, fan-out lines FL, a driving voltage line VDL, and a low potential line VSL may be located in the non-display area NDA of the substrate SUB of the display panel 100.

The driving voltage line VDL may be located between the multiplexer MUX and an edge on one side of the substrate SUB. The driving voltage line VDL may be located on the second interlayer insulating layer ILD2 and may be arranged to be spaced apart from the second fan-out lines FAN2. The driving voltage line VDL may be arranged so as not to overlap the second fan-out lines FAN2, and may be arranged to overlap the first fan-out lines FAN1.

The low potential line VSL may be arranged to surround the display area DA. The low potential line VSL may be located adjacent to the driving voltage line VDL to surround the driving voltage line VDL. The driving voltage line VDL may be located on the second interlayer insulating layer ILD2 and may be arranged to be spaced apart from the second fan-out lines FAN2. The low potential line VSL may be arranged so as not to overlap the second fan-out lines FAN2, and may be arranged to overlap the first fan-out lines FAN1.

As illustrated in FIGS. 17 and 18, the driving voltage line VDL may include a first extension portion EXP1 extending in the first direction (X-axis direction), a second extension portion EXP2 extending in the second direction (Y-axis direction), a first bending portion BA1 connecting the first extension portion EXP1 and the second extension portion EXP2, a third extension portion EXP3 parallel to the first extension portion EXP1, a second bending portion BA2 connecting the second extension portion EXP2 and the third extension portion EXP3, a fourth extension portion EXP4 parallel to the second extension portion EXP2, and a third bending portion BA3 connecting the third extension portion EXP3 and the fourth extension portion EXP4.

The first extension portion EXP1 may be arranged to extend in parallel with the display driving circuit 200. The second extension portion EXP2 may be arranged to extend in the second direction (Y-axis direction) from the first bending portion BA1 that is one end of the first extension portion EXP1. The third extension portion EXP3 may be arranged to be spaced apart from the first extension portion EXP1 and be in parallel with the first extension portion EXP1, and may be arranged to extend in the first direction (X-axis direction) from the second bending portion BA2 that is one end of the second extension portion EXP2. The fourth extension portion EXP4 may be arranged to be spaced apart from the second extension portion EXP2 and be in parallel with the second extension portion EXP2, and may be arranged to extend in the second direction (Y-axis direction) from the third bending portion BA3 that is one end of the third extension portion EXP3.

An inner portion of the driving voltage line VDL formed by the first to fourth extension portions EXP1, EXP2, EXP3, and EXP4 and the first to third bending portions BA1, BA2, and BA3 may form a well-shaped well portion WE. For example, the driving voltage line VDL may be formed in a shape recessed in a direction opposite to the first direction (X-axis direction) in plan view. The well portion WE, which is an area surrounded by the driving voltage line VDL, may be partitioned and/or defined by the driving voltage line VDL.

According to some embodiments, the well portion WE formed by the driving voltage line VDL may secure a space in which the contact holes PH1 and PH2 of the fan-out lines FL may be located. For example, the first fan-out lines FAN1 and the second fan-out lines FAN2 may be arranged to overlap the well portion WE of the driving voltage line VDL.

For example, the first-first fan-out line F1-1 is arranged to extend to the well portion WE of the driving voltage line VDL, and the second first fan-out line FAN2-1 corresponding to the first-first fan-out line F1-1 is also arranged to extend to the well portion WE. The first-first fan-out line F1-1 and the second-first fan-out line F2-1 may be connected to each other through the first contact hole PH1 located in the well portion WE. Similarly, the first-second fan-out line F1-2 is arranged to extend to the well portion WE of the driving voltage line VDL, and the second-second fan-out line F2-2 corresponding to the first-second fan-out line F1-2 is also arranged to extend to the well portion WE. The first-second fan-out line F1-2 and the second-second fan-out line F2-2 may be connected to each other through the second contact hole PH2 located in the well portion WE.

According to some embodiments, the well portion WE may be formed by bending the driving voltage line VDL. The well portion WE may provide an area in which the contact holes PH1 and PH2 of the fan-out lines FL are to be located. As the area in which the contact holes PH1 and PH2 are to be formed is secured by the well portion WE, the first fan-out lines FAN1 and the second fan-out lines FAN2 may be connected to each other.

Meanwhile, referring to FIG. 20, the contact holes PH1 and PH2 of the fan-out lines FL may be arranged to be adjacent to the display area DA in the first direction (X-axis direction) in a partial area.

The fan-out lines FL may be formed to have the same level of line resistance between the fan-out lines FL to prevent or reduce the occurrence of a deviation of a data signal transmitted to the display area DA. The first fan-out lines FAN1 extending from the outermost portion of the display area DA may have a longer length than the first fan-out lines FAN1 extending from the central portion of the display area DA. The long line length means that the line resistance is also large. According to some embodiments, the second fan-out line FAN2 connected to the first fan-out line FAN1 is formed to have a long length corresponding to the first fan-out line FAN1 having the long length, and the second fan-out line FAN2 connected to the first fan-out line FAN1 is formed to have a short length corresponding to the first fan-out line FAN1 having a relatively short length Accordingly, the data signals transmitted to the display area DA may be uniformly applied by matching the line resistances between the respective fan-out lines FL to the same level.

To this end, the contact holes PH1 and PH2 of the fan-out lines FL may be arranged to be adjacent to the display area DA in the first direction (X-axis direction) in a partial area. The meaning that the contact holes PH1 and PH2 are arranged to be adjacent to the display area DA may mean that the length of the second fan-out lines FAN2 is increased. That is, the lengths between the first fan-out lines FAN1 may be formed to be different from each other, and the lengths between the second fan-out lines FAN2 connected to the first fan-out lines FAN1 may also be formed to be different from each other. According to some embodiments, the length of the second fan-out lines FAN2 located at the outermost portion among the second fan-out lines FAN2 may be formed to have a length longer than the length of the second fan-out lines FAN2 located at the central portion.

As described above, as at least some of the contact holes PH1 and PH2 of the fan-out lines FL are arranged to be adjacent to the display area DA toward the central portion of the non-display area NDA in which the driving voltage line VDL is located, display quality may be relatively improved by matching the line resistances between the fan-out lines FL.

According to some embodiments, the left outermost portion of the fan-out lines FL is illustrated and described, but in the right outermost portion, the contact holes PH1 and PH2 of the fan-out lines FL may also be arranged to be adjacent to the display area DA from the outermost portion to the central portion. That is, shapes of the fan-out lines FL respectively located on the left and right sides with respect to the center of the fan-out lines FL may be symmetrical to each other.

According to some embodiments, the structure in which the substrate SUB is sealed by the encapsulation substrate TSUB is described as an example, but the present disclosure is not limited thereto. The substrate SUB may also be sealed by an encapsulation layer covering a portion of the display area DA and the non-display area NDA and in which an inorganic layer and an organic layer are alternately stacked.

In concluding the detailed description, those skilled in the art will appreciate that many variations and modifications can be made to the example embodiments without substantially departing from the spirit and scope of embodiments according to the present invention. Therefore, the described example embodiments of the invention are used in a generic and descriptive sense only and not for purposes of limitation.

What is claimed is:

1. A display device comprising:
- a substrate including a display area including a plurality of pixels and a non-display area around the display area;
- data lines extending from the display area;
- a multiplexer in the non-display area and connected to the data lines;
- a display driving circuit in the non-display area, separated from the multiplexer, and located farther from the display area than the multiplexer;
- fan-out lines connecting the multiplexer and the display driving circuit;
- a coupling member on the non-display area of the substrate and arranged around the display area; and
- an encapsulation substrate coupled to the substrate through the coupling member,
- wherein the fan-out lines include first fan-out lines connected to the multiplexer and second fan-out lines connected to the first fan-out lines and the display driving circuit,
- the first fan-out lines and the second fan-out lines are on different layers, and
- wherein the coupling member overlaps the first fan-out line and does not overlap the second fan-out line.

2. The display device of claim 1, wherein the first fan-out lines and the second fan-out lines include different materials.

3. The display device of claim 1, wherein the first fan-out lines include a first-first fan-out line and a first-second fan-out line spaced apart from each other, and
- the first-first fan-out line and the first-second fan-out line are alternately arranged along one direction.

4. The display device of claim 3, wherein the first-first fan-out line is electrically connected to a first one of the second fan-out lines corresponding to the first-first fan-out line through a first contact hole, and the first-second fan-out line is electrically connected to a second one of the second fan-out lines corresponding to the first-second fan-out line through a second contact hole.

5. The display device of claim 1, wherein the non-display area includes:

a first gate metal layer on the substrate;

a first interlayer insulating layer on the first gate metal layer;

a second gate metal layer on the first interlayer insulating layer;

a second interlayer insulating layer on the second gate metal layer; and a data metal layer on the second interlayer insulating layer.

6. The display device of claim 5, wherein the first fan-out lines include a first-first fan-out line and a first-second fan-out line spaced apart from each other, the first-first fan-out line is made of the first gate metal layer, the first-second fan-out line is made of the second gate metal layer, and the second fan-out lines are made of the data metal layer.

7. The display device of claim 1, further comprising a driving voltage line on the non-display area of the substrate and between the multiplexer and the display driving circuit, wherein the driving voltage line overlaps a first fan-out line from among the first fan-out lines and does not overlap a second fan-out line from among the second fan-out lines.

8. The display device of claim 7, further comprising a low potential line on the non-display area of the substrate and arranged around the display area, wherein the low potential line overlaps the first fan-out line and does not overlap the second fan-out line.

9. The display device of claim 8, wherein the driving voltage line and the low potential line are on a same layer as the second fan-out line, and are spaced apart from each other in a plan view.

10. A display device comprising:

a substrate;

a first-first fan-out line on the substrate;

a first interlayer insulating layer on the first-first fan-out line;

a first-second fan-out line on the first interlayer insulating layer;

a second interlayer insulating layer on the first-second fan-out line;

second fan-out lines on the second interlayer insulating layer;

a coupling member on the driving voltage line and the second interlayer insulating layer; and an encapsulation substrate on the coupling member, wherein a first one of the second fan-out lines overlaps the first-first fan-out line and is connected to the first-first fan-out line through a first contact hole, and a second one of the second fan-out lines overlaps the first-second fan-out line and is connected to the first-second fan-out line through a second contact hole, the first-first fan-out line and the first-second fan-out line include a material different from that of the second fan-out line, and wherein the coupling member overlaps the first-first fan-out line and the first-second fan-out line, and does not overlap a second fan-out line from among the second fan-out lines.

11. The display device of claim 10, further comprising:

a driving voltage line on the second interlayer insulating layer and spaced apart from the second fan-out lines; and a via layer on the driving voltage line and the second interlayer insulating layer.

12. The display device of claim 11, wherein the driving voltage line overlaps the via layer, the coupling member, the first-first fan-out line, and the first-second fan-out line.

13. The display device of claim 11, wherein the via layer includes a groove exposing a portion of the driving voltage line and a portion of the second interlayer insulating layer, and the coupling member is in the groove and is in contact with the driving voltage line and the second interlayer insulating layer.

14. An electronic device comprising:

a substrate including a display area and a non-display area around the display area;

a driving voltage line in the non-display area and configured to apply a driving voltage to the display area;

a display driving circuit in the non-display area and on one side of the driving voltage line; and fan-out lines electrically connecting the display area and the display driving circuit to each other, wherein the fan-out lines include first fan-out lines that overlap the driving voltage line and second fan-out lines that do not overlap the driving voltage line, and the first fan-out lines and the second fan-out lines include different materials.

15. The electronic device of claim 14, wherein the driving voltage line includes a bending portion formed in a bent shape in a plan view, and partitions a well portion that is an area surrounded by the bending portion.

16. The electronic device of claim 15, wherein the first fan-out lines are connected to the second fan-out lines through contact holes, and at least some of the contact holes overlap the well portion.

17. The electronic device of claim 14, wherein the first fan-out lines are connected to the second fan-out lines through contact holes, and at least some of the contact holes are spaced apart from each other in a first direction and spaced apart from each other in a second direction perpendicular to the first direction toward a center of the display area.

18. The electronic device of claim 17, wherein a virtual line connecting the contact holes is an oblique line passing between the first direction and the second direction.

19. The electronic device of claim 14, wherein at least two of the second fan-out lines include a contact portion connected to the first fan-out lines, a first area extending from the contact portion, a second area extending in a vertical direction, and a connection portion connecting the first area and the second area, and the connecting portion is a bent portion between the first area and the second area.

20. The electronic device of claim 19, wherein a length of the first area and a length of the second area are different from each other.

21. The electronic device of claim 19, wherein the at least two second fan-out lines have a length of the first area that decreases toward a center of the display area and a length of the second area that increases toward the center of the display area.

22. The electronic device of claim 19, wherein the at least two second fan-out lines have different lengths of the second area and different lengths of the first area.

* * * * *